US008173891B2

(12) United States Patent
Wanlass et al.

(10) Patent No.: US 8,173,891 B2
(45) Date of Patent: May 8, 2012

(54) MONOLITHIC, MULTI-BANDGAP, TANDEM, ULTRA-THIN, STRAIN-COUNTERBALANCED, PHOTOVOLTAIC ENERGY CONVERTERS WITH OPTIMAL SUBCELL BANDGAPS

(75) Inventors: Mark W. Wanlass, Golden, CO (US); Angelo Mascarenhas, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 1024 days.

(21) Appl. No.: 12/121,463

(22) Filed: May 15, 2008

(65) Prior Publication Data
US 2009/0229659 A1    Sep. 17, 2009

Related U.S. Application Data

(60) Continuation-in-part of application No. 11/027,156, filed on Dec. 30, 2004, which is a division of application No. 10/515,243, filed as application No. PCT/US02/16101 on May 21, 2002.

(51) Int. Cl.
 H01L 31/00 (2006.01)
 H01L 31/042 (2006.01)
 H01L 21/302 (2006.01)

(52) U.S. Cl. ........ 136/249; 136/255; 136/256; 136/261; 136/262; 438/37; 438/57; 438/93; 438/98; 438/705; 438/718; 438/745; 438/752; 438/753; 257/53; 257/184; 257/190; 257/191; 257/200; 257/201

(58) Field of Classification Search .................. 136/249, 136/255, 256, 261, 262; 438/37, 57, 93, 438/98, 705, 718, 745, 752, 753; 257/53, 257/184, 190, 191, 200, 201
See application file for complete search history.

(56) References Cited

U.S. PATENT DOCUMENTS

| 4,214,916 A | 7/1980 | Felsher et al. |
| 4,255,211 A | 3/1981 | Fraas |
| 4,278,474 A | 7/1981 | Blakeslee et al. |

(Continued)

FOREIGN PATENT DOCUMENTS

WO    03/100868    12/2003

(Continued)

OTHER PUBLICATIONS

Aiken, "Anti-reflection coating design for series interconnected multi-junction solar cells", Progress Photovoltaics; Research Applications, 2000, vol. 8 pp. 563-570.

(Continued)

*Primary Examiner* — Alexa Neckel
*Assistant Examiner* — Golam Mowla
(74) *Attorney, Agent, or Firm* — Paul J. White; W. LaNelle Owens; John C. Stolpa

(57) ABSTRACT

Modeling a monolithic, multi-bandgap, tandem, solar photovoltaic converter or thermophotovoltaic converter by constraining the bandgap value for the bottom subcell to no less than a particular value produces an optimum combination of subcell bandgaps that provide theoretical energy conversion efficiencies nearly as good as unconstrained maximum theoretical conversion efficiency models, but which are more conducive to actual fabrication to achieve such conversion efficiencies than unconstrained model optimum bandgap combinations. Achieving such constrained or unconstrained optimum bandgap combinations includes growth of a graded layer transition from larger lattice constant on the parent substrate to a smaller lattice constant to accommodate higher bandgap upper subcells and at least one graded layer that transitions back to a larger lattice constant to accommodate lower bandgap lower subcells and to counter-strain the epistructure to mitigate epistructure bowing.

14 Claims, 4 Drawing Sheets

U.S. PATENT DOCUMENTS

| | | | |
|---|---|---|---|
| 4,338,480 | A | 7/1982 | Antypas et al. |
| 4,881,979 | A | 11/1989 | Lewis |
| 4,963,508 | A | 10/1990 | Umeno et al. |
| 4,963,949 | A | 10/1990 | Wanlass et al. |
| 5,019,177 | A | 5/1991 | Wanlass |
| 5,053,083 | A | 10/1991 | Sinton |
| 5,322,572 | A | 6/1994 | Wanlass |
| 5,376,185 | A | 12/1994 | Wanlass |
| 5,407,491 | A | 4/1995 | Freundlich et al. |
| 5,479,032 | A | 12/1995 | Forrest et al. |
| 5,571,339 | A | 11/1996 | Ringel et al. |
| 5,716,459 | A | 2/1998 | Chang et al. |
| 5,853,497 | A | 12/1998 | Lillington et al. |
| 5,865,906 | A | 2/1999 | Ferguson et al. |
| 5,944,913 | A | 8/1999 | Hou et al. |
| 6,034,321 | A | 3/2000 | Jenkins |
| 6,107,562 | A | 8/2000 | Hashimoto et al. |
| 6,150,604 | A | 11/2000 | Freundlich et al. |
| 6,162,987 | A | 12/2000 | Murray et al. |
| 6,180,432 | B1 | 1/2001 | Freeouf |
| 6,218,607 | B1 | 4/2001 | Mulligan et al. |
| 6,239,354 | B1 | 5/2001 | Wanlass |
| 6,252,287 | B1 | 6/2001 | Kurtz et al. |
| 6,255,580 | B1 | 7/2001 | Karam et al. |
| 6,265,653 | B1 | 7/2001 | Haigh et al. |
| 6,281,426 | B1 | 8/2001 | Olson et al. |
| 6,300,557 | B1 | 10/2001 | Wanlass |
| 6,300,558 | B1 | 10/2001 | Takamoto et al. |
| 6,316,715 | B1 | 11/2001 | King et al. |
| 6,340,788 | B1 | 1/2002 | King et al. |
| 6,482,672 | B1 | 11/2002 | Hoffman et al. |
| 6,660,928 | B1 | 12/2003 | Patton et al. |
| 6,680,432 | B2 | 1/2004 | Sharps et al. |
| 6,815,736 | B2 | 11/2004 | Mascarenhas |
| 6,951,819 | B2 | 10/2005 | Iles et al. |
| 7,095,050 | B2 | 8/2006 | Wanlass et al. |
| 7,488,890 | B2 | 2/2009 | Takamoto et al. |
| 2006/0144435 | A1 | 7/2006 | Wanlass |
| 2006/0162768 | A1 | 7/2006 | Wanlass et al. |

FOREIGN PATENT DOCUMENTS

| | | |
|---|---|---|
| WO | 2004/017425 | 2/2004 |
| WO | 2004/022820 | 3/2004 |

OTHER PUBLICATIONS

Aiken, "High performance anti-reflection coatings for broadband multi-junction solar cells," Solar Energy Materials & Solar Cells, 2000, vol. 64, pp. 393-404.

Lamorte, et al., "Computer Modeling of a Two-junction, Monolithic Cascade Solar Cell," IEEE Transactions on Electron Devices, Jan. 1980, vol. 27, Issue 1, pp. 231-249.

Wanlass, et al., "A Rigorous Analysis of Series-Connected, Multi-Bandgap, Tandem Thermophotovoltaic (TPV) Energy Converters," Proc. Sixth Conference on Thermophotovoltaic Generation of Electricity (TPV6), 2004, pp. 462-470.

Wanlass, et al., "Lattice-Mismatched Approaches for High Performance, III-V Photovoltaic Energy Converters", 31st IEEE Photovoltaics Specialists Conference and Exhibition, Feb. 2005, pp. 1-6.

Yablonovich, et al., "Extreme selectivity in the lift-off of epitaxial GaAs films", Applied Physics Letters, Dec. 28, 1987, vol. 51, No. 26, pp. 2222-2224.

Zahler, et al., "Wafer Bonding and Layer Transfer Processes for 4-Junction High Efficiency Solar Cells", Proceedings of the 29th IEEE Photovoltaic Specialists Conference, May 2002, pp. 1039-1042 New Orleans, LA.

Official Action for U.S. Appl. No. 10/515,243, mailed Mar. 4, 2010.
Official Action for U.S. Appl. No. 10/515,243, mailed Jun. 18, 2009.
Official Action for U.S. Appl. No. 11/027,156, mailed Sep. 4, 2009.
Official Action for U.S. Appl. No. 11/027,156, mailed Mar. 5, 2010.
Written Opinion for for International (PCT) Application No. PCT/US02/16101, mailed Apr. 6, 2004.
International Preliminary Examination Report for International (PCT) Application No. PCT/US02/16101, mailed Aug. 30, 2004.
International Search Report of PCT/US02/16101, dated Sep. 6, 2002.

Wehrer, R. J. et al., "0.74/0.55-eV GaxIn1-x/As/InAsyP1-y Monolithic, Tandem, MIM TPV Converters: Design,Growth, Processing and Performance." Bettis RC&E.

Sinharoy, S. et al., "Progress in the Development of Metamorphic Multi-junction III-V Space Solar Cells," Prog. Photovolt: Res. Appl. vol. 10, 2002, pp. 427-432.

R. Venkatasubramanian et al., "An Inverted-Growth Approach to Development of an IR-Transparent, High-Efficiency AlGaAs/GaAs Cascade Solar Cell", Conf. Record of the 22nd IEEE Photovoltaic Specialists Conference, 1991, pp. 93-98.

MONOLITHIC, MULTI-BANDGAP, TANDEM, ULTRA-THIN, STRAIN-COUNTERBALANCED, PHOTOVOLTAIC ENERGY CONVERTERS WITH OPTIMAL SUBCELL BANDGAPS

CROSS-REFERENCE TO RELATED APPLICATIONS

This application is a continuation-in-part of U.S. patent application Ser. No. 11/027,156, filed on Dec. 30, 2004, which is a continuation-in-part of U.S. patent application Ser. No. 10/515,243, filed on Nov. 19, 2004, which is the national phase of international application no. PCT/US02/16101 filed on May 21, 2002, all of which are incorporated herein by reference for all that they disclose.

CONTRACTUAL ORIGIN

The United States Government has rights in this invention under Contract No. DE-AC36-99GO10337 between the United States Department of Energy and the National Renewable Energy Laboratory, a Division of Midwest Research Institute.

BACKGROUND

1. Technical Field

This invention is related to photovoltaic devices and, more specifically, to multi-bandgap, tandem, photovoltaic energy converters.

2. State of the Prior Art

It is well-known in photovoltaics that more efficient conversion of solar energy to electrical energy can be accomplished by matching the photon energy of the incident solar radiation to the amount of energy needed to excite electrons in the semiconductor material to transcend the bandgap from the valence band to the conduction band. Such matching avoids energy loss or waste due to the thermalization of excess photon energy over the amount of photon energy that is absorbed by the semiconductor for photon to electric energy conversion and due to insufficient photon energy to be absorbed and converted to electric energy by the semiconductor material. However, since solar radiation usually comprises a wide range of wavelengths, use of only one semiconductor material with one bandgap to absorb such radiant energy and convert it to electric energy results in large inefficiencies and energy losses to unwanted heat.

Ideally, there would be a semiconductor material with a bandgap to match the photon energy for every wavelength in the solar radiation. That kind of device is impractical, if not impossible, but persons skilled in the art are building monolithic stacks of several different semiconductor materials with different bandgaps into devices commonly called tandem converters and/or monolithic, multi-bandgap, tandem converters to get two, three, four, or more discrete bandgaps spread across the solar spectrum to match more closely to at least several different wavelength bands of radiation and, thereby, achieve more efficient conversion of radiant energy to electric energy. Essentially, in such devices, the radiation is directed first into higher bandgap semiconductor materials, which absorb shorter wavelength, higher energy portions of the incident radiation for conversion to electric energy, while the longer wavelength, lower energy portions of the radiation pass through such higher bandgap materials to lower bandgap materials, where they are absorbed and converted to electric energy. Therefore, the higher energy portions of the incident radiant energy are absorbed and converted to electric energy by the higher bandgap semiconductor materials in the stack without excessive thermalization and loss of energy in the form of heat, while the longer wavelength, lower energy portions of the radiation are transmitted to one or more subsequent semiconductor materials with smaller bandgaps for further selective absorption and conversion of remaining radiation to electrical energy.

Persons skilled in the art have developed various techniques for determining or "modeling" theoretical optimum discrete subcell bandgap combinations of two, three, four, five, or more cascaded subcells in a stack for extracting maximum electrical power from specific solar spectrums, e.g., standard solar spectrums AM0 (space above earth's atmosphere), AM1.5 (average sunny day on earth), AM2 (average sunny day at sea level), AOD85 (terrestrial concentrator), etc., at selected operating conditions, e.g., concentration ratio and operating temperature of the solar cell. See, e.g., M. W. Wanlass and D. S. Albin, "A Rigorous Analysis of Series-Connected, Multi-Bandgap, Tandem Thermophotovoltaic (TPV) Energy Converters," Proc. Sixth Conference on Thermophotovoltaic Generation of Electricity (TPV6), Freiburg, Germany, Jun. 14-16, 2004, AIP conf. proc. 738, pp. 462-470. and M. F. Lamorte and D. H. Abbott, "Computer Modeling of a Two-junction, Monolithic Cascade Solar Cell," IEEE Transactions on Electron Devices," Volume 27, Issue 1, January 1980, pages 231-249. There are also several computer programs available for use in modeling crystalline solar cells, for example, PC1D from the University of South Wales, Sidney, Australia, and Sim Windows from the University of Colorado, Boulder, Colo. USA. However, such modeling only provides the theoretical optimum subcell bandgaps for the solar spectrums, concentration ratios, and operating conditions. The challenge then is to find ways to grow the subcells continuously, and, further, to mitigate cost and make them durable.

Semiconductor compounds and alloys with bandgaps in the various energy ranges needed for efficient solar to electric energy conversion are known or achieveable, but that knowledge alone does not solve the problem of how to make the most efficient and useful solar to electric energy conversion devices. Defects in crystalline semiconductor materials, such as impurities, dislocations, and fractures provide unwanted recombination sites for photo-generated electron-hole pairs, resulting in decreased energy conversion efficiency. Therefore, high-performance, photovoltaic conversion cells comprising semiconductor materials with the desired bandgaps often require high quality, expitaxially grown crystals with few, if any, defects. Growing the various structural layers of semiconductor materials required for a multi-bandgap, tandem, photovoltaic (PV) conversion device in a monolithic form is the most elegant, and possibly the most cost-effective, approach.

Epitaxial crystal growth of the various compound or alloy semiconductor layers with desired bandgaps is usually most successful, when all of the materials are lattice-matched (LM), so that the semiconductor materials with layer crystal lattice constants are not interfaced with other materials that have smaller lattice constants or vice versa. Lattice-mismatching (LMM) in adjacent crystal materials causes lattice strain, which, when high enough, is usually manifested in dislocations, fractures, wafer bowing, and other problems that degrade or destroy electrical and other characteristics and capabilities of the device. Unfortunately, the semiconductor materials that have the desired bandgaps for absorption and conversion of radiant energy in some energy or wavelength bands do not always lattice match other semiconductor materials with other desired bandgaps for absorption and conversion of radiant energy in other energy or wavelength bands.

Co-pending U.S. patent application Ser. No. 10/515,243, which is incorporated herein by reference, addressed this problem primarily for low bandgap (e.g., less than 1.35 eV in this context), monolithic, multi-bandgap devices in order to convert lower energy, infrared radiation (e.g., ~927 to 3,483 nm) to electricity more efficiently. By the use of a combination of subcells lattice-matched (LM) to InP substrates, lattice constant transition layers, and lattice-mismatched (LMM) subcells, inverted monofacial and bifacial structures, ultra-thin monolithic, multi-bandgap, tandem structures, and other features, the inventions in that co-pending patent application could provide monolithic, multi-bandgap, tandem energy converters with subcell bandgaps in various combinations ranging from about 1.36 eV down to as low as about 0.35 eV. That range comprises invisible infrared energy.

Another co-pending U.S. patent application Ser. No. 11/027,156, which is also incorporated herein by reference, shows an inverted, ultra-thin design for a monolithic, multi-bandgap, tandem, photovoltaic converter combining lattice-matched (LM) medium and high bandgap materials with lattice-mismatched, low bandgap materials. The ability to include a low bandgap (less than about 1.2 eV) subcell in a monolithic, tandem, stack device along with medium (about 1.2 to 1.6 eV) and high (about 1.6 to 2.2 eV) facilitated achievement of higher solar to electric energy conversion efficiencies. However, while such higher conversion efficiencies facilitated by that design are significant, the design still has limitations and problems. For example, the bandgap for the lattice-matched (LM) Group III-V subcell GaInP is limited to about 1.9 eV for the top or front subcell on conventional, industry standard substrates, such as GaAs and Ge, unless Al is added to the GaInP, which typically introduces material problems that are usually best avoided. This practical limitation of 1.9 eV is significant, because it allows a substantial amount of solar energy in the shorter, more energetic, wavelength ranges of the solar spectrum, i.e., less than about 600 nm to be lost to thermalization.

Also, the lattice-mismatched subcells cause epiwafer bowing that can be problematic when growing devices on large substrates and when processing large devices even where graded layers are used to facilitate transition between materials with different lattice constants. This problem can be exacerbated in situations wherein the spectral range of the optimum bandgaps for maximum solar energy to electrical energy is broad, for example in converters with three or more subcells.

Other practical problems can also be encountered where the spectral range of the optimum bandgaps is broad. For example, typical antireflective coatings containing two or three layers cannot achieve low reflectance, i.e., less than a few (2-3) percent from the blue end of the solar spectrum all the way to about 0.7 eV infrared radiation, which is approximately the bandgap of active Ge bottom subcells used in state-of-the-art tandem solar cells. So far, better antireflective coatings able to achieve that kind of low reflectance over that kind of spectral range have not been reported.

Consequently, because of the practical problems associated with the broad spectral ranges of the optimum bandgaps in solar energy converters with three or more subcells, the maximum efficiencies predicted by the models that indicate such bandgaps have not been obtainable.

BRIEF DESCRIPTION OF THE DRAWINGS

The accompanying drawings, which are incorporated herein and form a part of the specification, illustrate some, but not the only or exclusive, example embodiments and/or features. It is intended that the embodiments and figures disclosed herein are to be considered illustrative rather than limiting.

In the drawings.

DETAILED DESCRIPTION OF EXAMPLE EMBODIMENTS

Figure 1:
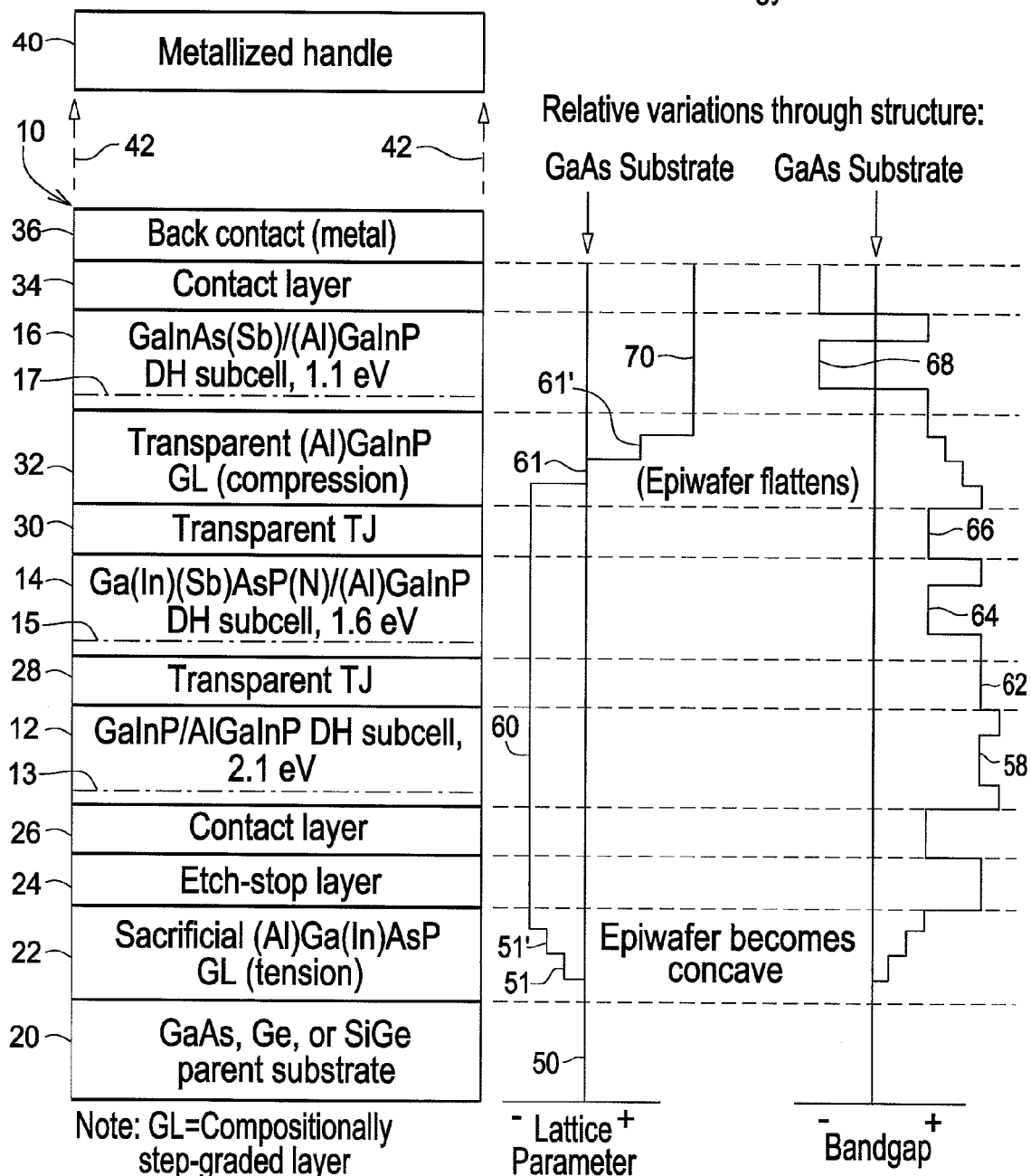
FIG. 1 is a diagrammatic view of the layers in an example monolithic, multi-bandgap, strain-counterbalanced, solar photovoltaic energy converter described herein with corresponding lattice parameters and bandgaps represented in graphical form adjacent the converter diagram.

An example monolithic, multi-bandgap, tandem (MMT) photovoltaic converter 10 shown in FIG. 1 is a generic representation illustrating at least three lattice-mismatched (LMM) subcells (12, 14, 16) grown epitaxially on a parent substrate 20 with at least one of the subcells having a bandgap in the high bandgap or energy range of about 1.7 to 2.4 eV, at least one of the subcells having a bandgap in the medium bandgap or energy range of about 1.2 to 1.7 eV, and at least one of the subcells having a bandgap in the low bandgap or energy range of about 0.7 to 1.2 eV. In these ranges, the word about means that each of the range high and low limits is plus or minus 0.1 eV, because different applications may require different high, medium, and low distributions. For example, but not for limitation, MMT photovoltaic converters as described herein may have applications in space as well as terrestrial uses, and terrestrial uses may be under conventional one sun intensity or in concentrator applications of several hundred to 1,000 suns or more. Also, bandgaps of semiconductor materials are temperature dependent. Therefore, some flexibility in the bandgap ranges may be needed for optimal or desirable structures and parameters according to the methods described herein.

In the example monolithic, multi-bandgap, tandem (MMT), photovoltaic converter 10 in FIG. 1, the structure is inverted with the front or top subcell 12 having a bandgap (e.g., 2.1 eV) in the high energy range being the first subcell grown on the parent or growth substrate 20, followed by the middle subcell 14 having a bandgap (e.g., 1.6 eV) in the middle energy range, and the bottom or back subcell 16 having a bandgap (e.g., 1.1 eV) in the low energy range as opposed to conventional structures in which the lowest bandgap subcells are grown first. Therefore, before the converter 10 in this example can be used, it is mounted on a handle (secondary support substrate) 40, as indicated by the broken line arrows 42 in FIG. 1, and the growth (parent) substrate 20 as well as the graded layer 22 are removed so that the solar radiation can be directed into the converter 10 in a manner to encounter the higher bandgap subcell 13 first, before the medium and lower bandgap subcells 14, 16. Example inverted monolithic, multi-bandgap, converter structures and methods of fabricating them are explained in co-pending patent application Ser. Nos. 11/027,156 and 10/515,243, both of which are incorporated herein by reference. However, the modeling and design methods as well as the counterbalancing graded layers (tension in the growth plane versus compression in the growth plane) as described in more detail below, can be used in both inverted (subcell bandgaps grown from high to low) and conventional structures (subcell bandgaps grown from low to high).

A number of practical problems and obstacles to attainment of the predicted efficiencies from modeled optimum bandgaps for the maximum solar energy conversion efficiencies, i.e., "global" solutions, can be mitigated by constraining the low bandgap value to something higher than the lowest bandgap in an optimum bandgap distribution for a particular solar spectrum, concentration and operating temperature where there are no constraints on the modeled bandgaps using such constraint can still lead to very high energy conversion efficiencies for a given solar spectrum, concentration, and operating temperature, and it is very practical to attain them. In fact, using this less-than-maximum efficiency method of modeling subcell bandgaps, as will be described in more detail below, can produce practical multi-bandgap, monolithic, photovoltaic energy converters with energy conversion efficiencies that are not only almost as good as the theoretical maximum energy conversion efficiencies, but that are also actually more attainable. In this regard, we have found that: (i) constraining the bottom subcell bandgap to a value higher than the lowest bandgap in an optimum bandgap distribution from an unconstrained "global" solution model conversion efficiency tends to also move the bandgaps for the intermediate and top subcells to somewhat higher values than the intermediate and top bandgaps in the unconstrained "global" solution model; and (ii) such larger bandgap values have the effect of lowering energy losses due to reflection and to electron thermalization, as compared to the unrestrained ("global") solution, which offsets most of the energy radiation conversion forfeited by not having the optimum low bandgap specified in the global (unconstrained) solution model. Consequently, the constrained solutions yield nearly the same energy conversion efficiencies as the global, unconstrained solutions, as shown by comparing the example global (unconstrained) model bandgap distributions in Table I for two, three, four, and five subcell, series connected, tandem solar energy converters operated under AM0 solar spectrum (space), one sun, at 25° C. to the example constrained, low bandgap model distributions in Table II under the same solar spectrum, concentration, and operating temperature. At the same time, while the bandgaps from such constrained modeling tend to be higher than from the global (unconstrained) modeling, the range between the lowest to highest bandgaps from such constrained modeling tends to be less than the range between the lowest to highest bandgaps from the global (unconstrained) modeling. Therefore, the anti-reflective coatings (ARC) for MMT photovoltaic converters built according to such constrained modeling do not have to perform over as broad a spectral range to be effective. Therefore, the ability to provide more effective ARC over the somewhat narrower spectral ranges derived from the constrained modeling along with optimal multiple bandgap distributions over such narrower spectral ranges can contribute to the ability of actual MMT photovoltaic converters made according to such constrained modeling to absorb and convert a somewhat higher percentage of incident radiation in such spectral ranges than in MMT photovoltaic converters made according to unconstrained modeling. Also the range of lattice mismatch (LMM) that has to be accommodated is less for MMT photovoltaic converters made according to constrained modeling than for MMT photovoltaic converters built according to global (unconstrained) modeling so they are less susceptible to defects and other adverse effects of lattice mismatch that lower quality and energy conversion efficiencies.

TABLE I

Modeled optimum subcell bandgaps, example subcell absorber materials, and conversion efficiencies for series-connected tandem solar cells operated under the E492 spectrum (space), one sun, 25° C. (total irradiance of AM0 = 1,366.1 W/m²). These results represent the global solution (i.e., the bottom subcell bandgap was not constrained).

| # Subcells | $E_{g1}$ (eV) | $E_{g2}$ (eV) | $E_{g3}$ (eV) | $E_{g4}$ (eV) | $E_{g5}$ (eV) | Eff. (%) |
|---|---|---|---|---|---|---|
| 2 | 1.74 Ga(In)AsP | 1.06 GaInAs | | | | 33.3 |
| 3 | 1.96 GaInP | 1.35 GaInAs | 0.91 GaInAs | | | 38.1 |
| 4 | 2.11 (Al)GaInP | 1.55 GaAsP | 1.14 GaInAs | 0.81 GaInAs | | 41.1 |
| 5 | 2.22 (Al)GaInP | 1.68 GaAsP | 1.30 GaInAs | 1.00 GaInAs | 0.74 GaInAs | 43.0 |

TABLE II

Modeled optimum subcell bandgaps, example subcell absorber materials, and conversion efficiencies for series-connected tandem solar cells operated under the AM0 spectrum (space), one sun, 25° C. (total irradiance of AM0 = 1,366.1 W/m²)0. For these results, the bottom subcell bandgap was constrained to be no less than 0.9 eV.

| # Subcells | $E_{g1}$ (eV) | $E_{g2}$ (eV) | $E_{g3}$ (eV) | $E_{g4}$ (eV) | $E_{g5}$ (eV) | Eff. (%) |
|---|---|---|---|---|---|---|
| 2 | 1.74 Ga(In)AsP | 1.06 GaInAs | | | | 33.3 |
| 3 | 1.96 (Al)GaInP | 1.35 GaInAs | 0.91 GaInAs | | | 38.1 |
| 4 | 2.16 (Al)GaInP | 1.61 GaAsP | 1.21 GaInAs | 0.90 GaInAs | | 40.8 |
| 5 | 2.32 (Al)GaInP | 1.82 GaAsP | 1.46 GaAsP | 1.16 GaInAs | 0.90 GaInAs | 42.4 |

TABLE III

Modeled optimum subcell bandgaps, example subcell absorber materials, and conversion efficiencies for series-connected tandem solar cells operated under the AOD85 spectrum (terrestrial concentrator), 500 suns, 50° C. (total irradiance = 1,000 W/m²). These results represent the global solution (i.e., the bottom subcell bandgap was not constrained).

| # Subcells | $E_{g1}$ (eV) | $E_{g2}$ (eV) | $E_{g3}$ (eV) | $E_{g4}$ (eV) | $E_{g5}$ (eV) | Eff. (%) |
|---|---|---|---|---|---|---|
| 2 | 1.57 GaAsP | 0.94 GaInAs | | | | 37.7 |
| 3 | 1.75 Ga(In)AsP | 1.18 GaInAs | 0.70 GaInAs | | | 42.4 |
| 4 | 1.96 (Al)GaInP | 1.47 GaAsP | 1.11 GaInAs | 0.73 GaInAs | | 45.4 |
| 5 | 2.07 (Al)GaInP | 1.61 GaAsP | 1.26 GaInAs | 0.99 GaInAs | 0.70 GaInAs | 47.3 |

TABLE IV

Modeled optimum subcell bandgaps, example subcell absorber materials, and conversion efficiencies for series-connected tandem solar cells operated under the AOD85 spectrum (terrestrial concentrator), 500 suns, 50° C. (total irradiance = 1,000 W/m²). For these results, the bottom subcell bandgap was constrained to be not less than 0.9 eV.

| # Subcells | $E_{g1}$ (eV) | $E_{g2}$ (eV) | $E_{g3}$ (eV) | $E_{g4}$ (eV) | $E_{g5}$ (eV) | Eff. (%) |
|---|---|---|---|---|---|---|
| 2 | 1.57 GaAsP | 0.94 GaInAs | | | | 37.7 |
| 3 | 1.86 Ga(In)AsP | 1/34 GaInAs | 0.90 GaInAs | | | 42.1 |
| 4 | 2.03 (Al)GaInP | 1.56 GaAsP | 1.21 GaInAs | 0.92 GaInAs | | 44.6 |
| 5 | 2.16 (Al)GaInP | 1.73 GaAsP | 1.42 GaAs | 1.16 GaInAs | 0.92 GaInAs | 46.3 |

For the example subcells in Tables I and III, the rigorous analysis technique described in M. W. Wanlass and D. S. Albin, "A Rigorous Analysis of Series-Connected, Multi-Bandgap, Tandem Thermophotovoltaic (TPV) Energy Converters," Proc. Sixth Conference on Thermophotovoltaic Generation of Electricity (TPV6), Freiburg, Germany, Jun. 14-16, 2004, AIP conf. proc. 738, pp. 462-470, was used for modeling the optimum global (unconstrained) bandgap combinations for maximum power conversion efficiency with two, three, four, and five subcells under the respective indicated solar spectra, concentrations, and operating temperatures. In other words, none of the subcell bandgap values were constrained, so each of the resulting bandgap combinations for two, three, four, or five subcells are optimum for maximum energy conversion from that solar spectrum, concentration, and operating temperature. For the example subcells in Tables II and IV, the same solar spectra, concentrations, and operating temperatures were used as those for the Tables I and III, respectively, and the same modeling technique was used, except that the bottom subcell bandgap was constrained to a value of no less than 0.9 eV for the Tables II and IV examples. Therefore, each of the resulting bandgap combinations for two, three, four, or five subcells in Tables II and IV is optimum for the maximum energy conversion subject to that constraint. Other subcell modeling techniques or computer modeling programs known in the art could also be used for the calculations of the unconstrained and constrained optimum bandgap combinations, and, while specific bandgap values obtained with such other modeling techniques or computer modeling programs might not be exactly the same as the bandgap values in Tables I-IV, depending on the specific modeling techniques, computer programs, and/or parameters used, the basic principles or teachings illustrated by the bandgap values in Tables I-IV should be the same.

As will be explained in more detail below, while the unconstrained optimum bandgap combinations and the constrained optimum bandgap combinations may turn out to be the same for two or even three subcells for some spectra, concentrations, and operating temperatures, depending on what lowest allowable bandgap value is chosen for the bottom subcell constraint, the unconstrained optimum bandgap combinations may be different than the constrained optimum bandgap combinations for larger numbers of subcells. Further, as will also be explained in more detail below, while it may be exceedingly difficult, if not impossible, to fabricate usable or economically feasible monolithic, multi-bandgap, tandem solar energy converters comprising the ideal, unconstrained optimum bandgap combinations due to material, physical, and other limitations, for example, in lattice mismatch (LMM) effects and anti-reflective coating (ARC) limitations, the constrained optimum bandgap combinations may mitigate those limitations, yet facilitate the ability to provide actual energy conversion efficiencies nearly as good as the theoretical, but unattainable, energy conversion efficiencies of the unconstrained optimum bandgap combinations.

As shown in Table I, the global (unconstrained) model for the most efficient two-subcell solar energy converter for the AM0 spectrum (space), one sun, at 25° C. would have a top subcell of 1.74 eV and a bottom subcell of 1.06 eV for a theoretical energy conversion efficiency of 33.3 percent. The unconstrained optimum bandgap combination for a three-subcell solar energy converter for those conditions would be 1.96 eV for the top subcell, 1.35 eV for the middle subcell, and 0.91 eV for the bottom subcell to yield a theoretical energy conversion efficiency of about 38.1 percent. Continuing the unconstrained bandgap modeling into even more complex subcell converter structures, a four-subcell model has unconstrained optimum bandgaps of 2.11 eV, 1.55 eV, 1.14 eV, and 0.81 eV for a theoretical conversion efficiency of 41.1 percent, and a five-subcell unconstrained model has an unconstrained optimum bandgap distribution of 2.22 eV, 1.68 eV, 1.30 eV, 1.00 eV, and 0.74 eV, respectively, for a theoretical conversion efficiency of 43.0 percent. Note the wide spectrum of bandgaps, especially in the four-subcell model (2.11 eV to 0.81 eV) and in the five-subcell model (2.22 eV to 0.74 eV).

For the example values in Table II, the same conditions were used as those for the Table I examples, except the bottom subcell was constrained to have a bottom bandgap of no less than 0.9 eV. The modeling software was then operated to find the optimum bandgap distribution that would yield the most efficient solar energy conversion with the constraint that the bottom cell bandgap could be no less than 0.9 eV. The constraint of 0.9 eV as the minimum bandgap for the bottom cell is for example only, and other values can be tried and used depending on the desired results and advantages for particular applications, e.g., particular spectrum characteristics, atmospheric conditions, operating temperatures, semiconductor materials, anti-reflective coating characteristic costs, processing abilities, etc. With that constraint, i.e., no less than 0.9 eV on the bottom subcell bandgap in these examples, the optimum solutions for all of the remaining middle and/or upper subcells have higher bandgaps for those remaining middle and/or upper subcells than the bandgaps of the respective corresponding subcells in the global (unconstrained) solution, and, surprisingly, those optimum bandgaps for the constrained solution models in Table II show overall energy conversion efficiencies only slightly lower than the global (unconstrained) solution models in Table I for corresponding numbers of subcells.

For example, the highest efficiencies for the example four-subcell and five-subcell, constrained solutions in Table II with the bottom subcell bandgap constrained to be no less than 0.9 eV in these examples show the theoretical maximum efficiencies of those subcell combinations are 40.8 percent and 42.4 percent, respectively, as compared to the theoretical maximum efficiencies of 41.1 percent and 43.0 percent, respectively, for the optimum unconstrained (global) models for four-subcell and five-subcell solar energy converters in Table I. In other words, by constraining the bottom subcell to have a bandgap of no less than 0.9 eV and allowing the remaining middle and/or upper subcell bandgaps to be readjusted for optimum values in view of that constraint, the theoretical maximum efficiency of both four- and five-subcell solar converters decreased by less than one (1) absolute percent efficiency.

At the same time, the increase in the lowest bandgap from 0.70 eV to 0.92 eV is very significant with respect to the anti-reflective coating (ARC), because currently available materials and technologies for ARC's are not conducive to producing broadband ARC's that are effective for wavelengths that span from the shortest wavelengths in the solar spectrum, i.e., about 250 nm for space and about 300 nm for terrestrial, to the longest wavelengths defined by the bandgaps of the subcells in the global (unconstrained) solutions. In fact, current ARC materials and technologies cannot produce ARC coatings that are very effective for even a span from the shortest wavelengths in the solar spectra to 1,771 nm, which is about the longest wavelength that can be absorbed and converted to electric energy by a semiconductor material with a 0.70 eV bandgap, i.e., approximately the bandgap values of the bottom subcells in the optimum unconstrained subcell combinations of five subcells in Table I (0.74 eV) and of three, four, and five subcells in Table III (0.70 eV, 0.73 eV, and 0.70 eV, respectively).

Consequently, while the example optimum unconstrained subcell combinations of five subcells in Table I and of three, four, and five subcells in Table III require bottom subcells with bandgaps at or near 0.70 eV, the inability of current materials and ARC technologies to provide effective anti-reflection performance for the entire spectrum from the shortest wavelengths to all those that can be absorbed and converted to electric energy by semiconductor materials with bandgaps at or near 0.70 eV means that some of the light energy in that span of the solar spectrum will be reflected and not converted to electric energy in spite of the modeled optimum bandgap combinations and conversion efficiencies in the unconstrained solutions. Consequently, the maximum energy conversion efficiencies calculated for such optimum unconstrained model subcells are not achievable, at least not with current ARC materials and technologies.

On the other hand, recognizing this limitation along with the knowledge gained from the constrained solutions, such as those shown in Tables II and IV above, i.e., that almost as good energy conversion efficiencies can be obtained according to the optimum constrained multi-bandgap models as according to the global (unconstrained) models, allows one to concentrate efforts on producing anti-reflective coatings that are effective for narrower spans of the spectrum, for example, from the shortest wavelengths in the solar spectrums to those that are absorbable by the somewhat higher bottom subcell bandgaps, for example, at or near 0.90 eV (1,378 nm), which are achievable with current materials and ARC technologies. Persons skilled in the art are well aware of how to make anti-reflective coatings, although with conventional ARC technology, it is still difficult to achieve low broad-band reflectance extending from the ultraviolet (~300 nm) out and into the infrared when the long wavelength cutoff exceeds ~1,400 nm. See, e.g., Danile J. Aiken, "Antireflection coating design for series interconnected multi-junction solar cells," Prog. Photovolt: Res. Appl. 2000; Vol. 8 pp. 563-570; and Daniel J. Aiken, "High performance anti-reflection coatings for broadband multi-junction solar cells," Solar Energy Materials & Solar Cells 64 (2000), pp. 393-404. Further, with the anti-reflective coatings that are effective over the portions of the solar spectrum that can be absorbed by the constrained optimum bandgap combinations, the actual energy conversion efficiencies achievable by such constrained optimum bandgap combinations in actual monolithic, multi-bandgap, tandem solar photovoltaic converter structures are substantially more than the actual energy conversion efficiencies that are achievable by actual monolithic, multi-bandgap, tandem solar photovoltaic converter structures with the unconstrained optimum bandgap combinations with the less effective anti-reflective coatings.

Figure 3:
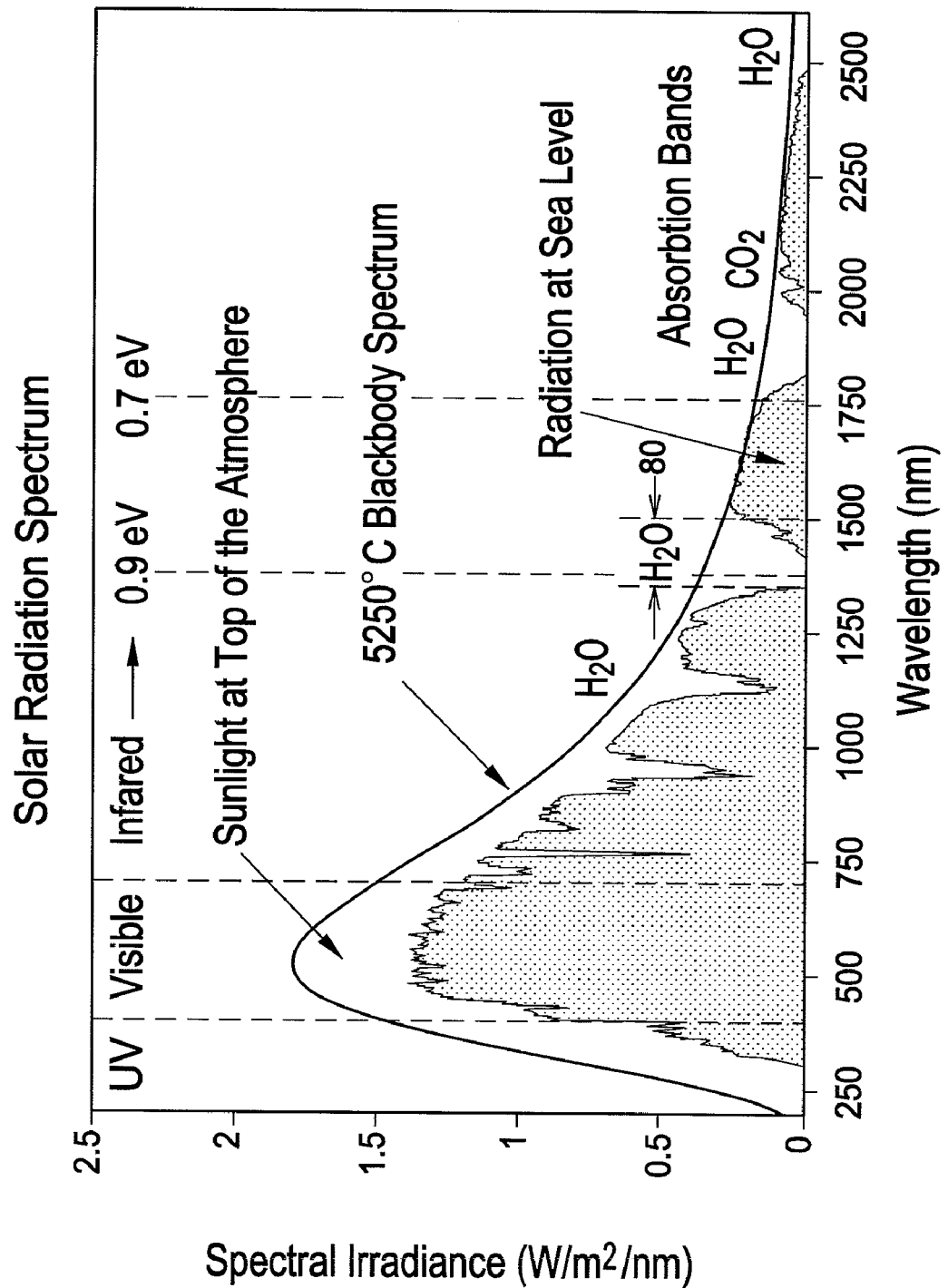
FIG. 3 is a graphical depiction of the spectral irradiance of the solar spectrum above the atmosphere and at sea level as a function of wavelength.

As shown by the bandgap values for the example four-subcell and five-subcell models in Tables III and IV, similar results are indicated for the global (unconstrained) solutions (Table III) and the constrained solutions (Table IV) for terrestrial solar concentrator applications, assuming operations under the AOD85 spectrum (terrestrial concentrator), 500 suns, at 50° C. In the example constrained models in Table IV, the bottom subcell bandgaps were also constrained to no less than 0.9 eV. Again, 0.9 eV as the minimum bandgap for the bottom subcell is only an example, and other minimum bandgap values for the bottom subcells can also be tried in the modeling process to see if they produce more desirable results for particular situations or needs, as explained above. However, the selection of about 0.9 eV (plus or minus 0.05 eV) is particularly attractive for terrestrial applications, i.e., where the sunlight passes through at least some of the earth's atmosphere before reaching the monolithic, multi-bandgap, photovoltaic converter, because, as shown in FIG. 3, a band 80 of the infrared solar energy starting from about 1,350 nm and extending to about 1,500 nm is substantially absorbed by the atmosphere (mostly due to water vapor). Since much of the solar energy in that band of solar radiation is not available for conversion by terrestrial positioned photovoltaic converters anyway and the even longer wavelength solar radiation that is not absorbed by the atmosphere, e.g., about 1,500 nm and longer, is quite low energy, setting the minimum bandgap at a value that absorbs and converts only shorter wavelength, higher solar energy radiation provides many of the advantages of the constrained optimum bandgap combinations discussed herein with only insignificant loss of the longer wavelength, lower energy, solar radiation. Therefore, since semiconductor materials with a bandgap of about 0.9 eV will absorb and convert solar energy of about 1,378 nm and shorter to electric energy, and much of the solar energy in wavelengths longer than 1,378 nm is either absorbed by the atmosphere or just relatively low energy anyway, modeling with the bottom subcell bandgap constrained to no less than about 0.9 eV (±0.05 eV) is a beneficial modeling parameter, especially for terrestrial applications. In the examples shown in Tables III and IV, this constraint of no less than 0.9 eV bandgap for the bottom subcells did impose other optimum or new optimum bandgap values on the middle and top subcells for the three-subcell example converter for the terrestrial concentrator application, as shown in Tables III and IV, whereas the optimum bandgap values in the three-subcell converter example for non-concentrator space applications in Tables I and II was not affected by the minimum 0.9 eV constraint on the bottom subcell. Also, the 0.9 eV example constraint did not alter the two-subcell optimum bandgaps for either the non-concentrator space or the terrestrial concentrator models.

As explained above, the theoretical high efficiency performance of the solar energy converters that are modeled with bottom subcell bandgaps constrained to minimum values higher than they would be in an unconstrained model result in higher optimum bandgap solutions for the middle and upper subcells. Therefore, to implement an actual monolithic, multi-bandgap, tandem solar converter structure that provides the optimum bandgaps according to the constrained model, higher bandgap materials have to be incorporated into the structure. Group III-V semiconductor alloys can be formulated to provide those bandgaps, but additional mitigation of the adverse effects of lattice mismatch is desirable to accommodate the higher model bandgaps of the upper subcells as well as the model bandgaps of the middle and lower subcells. One such example mitigation technique, which will be discussed in more detail below, includes the provision of a lattice graded layer (GL) to transition from the lattice constant of a GaAs or Ge growth substrate to a smaller lattice constant of a Group III-V alloy with a high bandgap for the top subcell and then, after growing the top subcell and, optionally, one or more middle subcells with such smaller lattice constant, providing one or more reverse graded layers (GL) to transition from such smaller lattice constant to one or more larger lattice constant(s). The larger lattice constant(s) accommodate(s) one or more Group III-V semiconductor alloys that have such larger lattice constant(s) and corresponding lower bandgap for the bottom subcell and, optionally, one or more middle subcells with larger lattice constant(s). For example, while the first graded layer transitions from a lattice constant of a GaAs or Ge parent substrate to a smaller lattice constant for at least one upper bandgap subcell, the second graded layer transitions from that smaller lattice constant to a larger lattice constant, which may or may not be larger than the lattice constant of the parent substrate, in order to accommodate at least one lower bandgap subcell. For convenience, a graded layer (GL) that transitions from a larger to a smaller lattice constant may sometimes be denoted as a −GL, and a graded layer (GL) that transitions from a smaller to a larger lattice constant may sometimes be denoted as a +GL. Beneficially, the second graded layer (+GL), which causes compression in the epistructure, at least partially, if not entirely, offsets the tension and resulting bowing in the epistructure caused by the first graded layer (−GL), as will be discussed in more detail below.

The constrained optimum bandgap combinations, especially for some of the larger number of subcells in the combination, e.g., the three subcells in Table IV and the four and five subcell bandgap combinations in Tables II and IV, also narrow the range of lattice constants for the subcells, i.e., the magnitudes of lattice mismatches, that have to be accommodated as compared to their unconstrained optimum bandgap combination counterparts in Tables I and III. For example, in the unconstrained, five-subcell model in Table I, the bottom subcell has a bandgap of 0.74 eV, whereas the constrained, five-subcell model in Table II has a bottom subcell with a bandgap of 0.90 eV. Therefore, the last +GL for the unconstrained model has to grade up to an in-plane lattice constant of about 5.87 Å, whereas the last +GL for the constrained model has to grade up to an in-plane lattice constant of only about 5.81 Å. Therefore, the constrained model also has the advantages of curtailing the wide bandgap spectral excursions and the associated mismatch magnitudes that are allowed by the unconstrained model.

Referring, again, to FIG. 1, such inverted structures as developed and described at least in part in the co-pending U.S. patent application Ser. Nos. 10/515,243 and 11/027,156 began a departure from over twenty (20) years of conventional thought, research, and development efforts in the solar cell industry and scientific groups by growing at least two subcells in a monolithic, multi-bandgap, tandem solar photovoltaic converter epitaxially, starting with the higher bandgap semiconductor materials and proceeding to the lower bandgap materials, at least one of which is lattice-mismatched (LMM) to the parent substrate 20. That departure is completed by the MMT photovoltaic converters described herein, wherein all of the subcells are lattice-mismatched to the parent substrate 20. For clarification, the term parent substrate as used in this context means the wafer that is loaded into a reactor or growth system and on which the deposition of a first graded layer, either −GL or +GL, which first introduces strain into the structure, is made. Therefore, a so-called virtual substrate, as that term is sometimes used to denote the combination of a substrate with a graded layer that has been grown in a reactor or growth system to provide a desired lattice constant in the growth plane, would not be considered a parent substrate. However, such a virtual substrate may itself have a parent substrate, wherein the parent substrate in such virtual substrate would be the initial substrate on which the graded layer is grown to make the virtual substrate.

This departure, wherein all of the subcells in a MMT photovoltaic converter are lattice-mismatched to the parent substrate, leaves no vestiges of the previous practices and conventional thought, which clung to the lattice-matched paradigm. Therefore, it is a complete departure in that sense, which opens the field to new solutions and advantages, including, but not limited to, the ability to provide the constrained optimum bandgap combinations described above for actually achieving near the highest theoretical conversion efficiencies, but with structures that mitigate the practical problems of excessively wide bandgap spectral excursions and associated lattice-mismatch magnitudes, epiwafer bowing, ARC limitations, etc.

For example, the ability to grow subcells epitaxially with bandgaps higher than 1.9 eV in a monolithic, multi-bandgap, tandem, photovoltaic converter, such as subcell 12 in FIG. 1, along with lower bandgap subcells, such as subcells 14, 16 in FIG. 1, on industry standard Ge or GaAs substrates is an advantage. However, other features described herein are also important, including, inter alia, minimizing and possibly eliminating epiwafer bowing due to lattice strain from graded layers and the ability to continuously tune subcell bandgaps to match particular applications and different, more optimal models with better temperature coefficients, better heat management, and lower Joule ($I^2R$) losses as will be described in more detail below.

In the context of this description, as well as in the vernacular of the solar cell industry, the terms "front" and "back" in solar cells refers to the direction that radiation propagates through the solar cell so that the solar radiation is initially incident on the front of the solar energy converter structure and propagates toward the back of the structure. Also, the term "top" is synonymous with "front" in this context, and "bottom" is synonymous with "back". Therefore, the terms "front" and "top" refer to the end, portions, or components of the cell where the radiation is first incident on the cell, whereas the terms "back" and "bottom" refer to the end, portions, or components of the cells that are farthest away from where the radiation is first incident on the cell. The "middle", "mid-", or "intermediate" is somewhere between the front (top) and back (bottom) of the cell.

Also, alloys are described herein with conventional notations understood by persons skilled in the art, such as (Al)GaInP or GaInAs(P), which is generic for any ternary or quaternary alloy having stoichiometric quantities of the included elements and where the element in parentheses is the optional element, the absence of which indicates a ternary alloy of the other elements and the presence of which indicates a quaternary alloy. (Al)GaInP and GaInAs(P) can also be written as $Al_xGa_yIn_{1-x-y}P$ and $Ga_xIn_{1-x}As_yP_{1-y}$, respectively.

Lattice match(ed) refers to adjacent crystalline materials that have lattice constants which are not sufficiently different to cause lattice strain that results in dislocations, fractures, wafer bowing, or other problems which degrade or destroy electrical or other characteristics or capabilities of the device. Lattice mismatch(ed) refers to adjacent crystalline materials that are sufficiently different to cause enough lattice strain to result in dislocations, fractures, wafer bowing, or other problems which degrade or destroy electrical or other characteristics or capabilities of the device.

In the example of FIG. 1, incident radiation reaches the subcell 12 first, where portions of the radiation that have enough photon energy to excite electrons in the subcell 12 semiconductor material to transcend the bandgap from the valence band to the conduction band (2.1 eV in this example), are absorbed, and the remainder of the radiation is transmitted through the front subcell 12 to the next subcell 14. At the middle subcell 14, the portions of the remaining radiation that have enough photon energy to excite electrons in the subcell 14 semiconductor material to transcend the bandgap from the valence band to the conduction band (1.6 eV in this example) are absorbed, and the remainder of the radiation is transmitted through the middle subcell 14 to the next subcell 16. At the back subcell 16, the portions of the remaining radiation that have enough photon energy to excite electrons in the subcell 16 semiconductor material to transcend the bandgap from the valence band to the conduction band (1.1 eV in this example) are absorbed.

The term "inverted", in the context of this example, monolithic, multi-bandgap, tandem, photovoltaic converter 10 is accurate in the sense that it is consistent with the sequential order that the subcells 12, 14, 16 are grown on the parent substrate 20, which, because of the sequentially descending bandgaps, as described above, would require the radiation to pass first through the parent substrate 20, if the parent substrate 20 was transparent to all the incident radiation and was left on the monolithic structure of the MMT photovoltaic converter 10. However, since one of the advantages of this invention is the ability to fabricate the high bandgap subcells with bandgaps greater than 1.9 eV on industry standard GaAs and Ge substrates, which are not transparent to radiation with such higher photon energies, the parent substrate 20 and the graded layer 22 are removed after the monolithic, multi-bandgap, tandem, photovoltaic converter 10 is mounted on a handle 40, as indicated by the arrows 42 and described below. Therefore, the incident radiation does not pass through the parent substrate 20 and GL 22, but the monolithic, multi-bandgap, tandem, solar photovoltaic converter 10 is still considered to be an "inverted" subcell structure, since that terminology is consistent with the manner in which previous monolithic, multi-bandgap, tandem, photovoltaic devices have been labeled when the higher bandgap subcells are grown first on a substrate and followed by growth of lower bandgap subcells on the higher bandgap subcells.

In the example, three-subcell, monolithic, multi-bandgap, tandem (MMT), solar photovoltaic converter 10 in FIG. 1, a sacrificial, first compositionally graded layer 22 comprising Group III-V semiconductor compound or alloy material is grown epitaxially on the parent substrate 20, which is also sacrificial. As mentioned above, the term parent substrate means the wafer that is loaded into the reactor or growth chamber and on which the first deposition is made. The term "sacrificial" as used herein refers to the fact that these components 20, 22, will be etched away or otherwise removed after the MMT photovoltaic converter 10 is mounted on the handle 40, as will be explained in more detail below. The first graded layer 22 is compositionally graded to have a starting lattice constant (sometimes also known as "lattice parameter") that matches the lattice constant of the parent substrate 20 and to terminate with a lower lattice constant that, in the growth plane, matches a Group III-V semiconductor material with a high bandgap, as desired for the front subcell 12.

As a point of clarification of this discussion and elsewhere in this description, persons skilled in the art know that a graded layer grown directly on a substrate or other layer that is not within the active device, i.e., where there has not yet been a subcell grown, can start with a material that is lattice matched to such substrate or other layer, or it can start with a first graded step that starts grading away from the lattice constant of such substrate or other layer. Therefore, for convenience and to minimize cumbersome, repetitious, recitations herein to the effect that a graded layer starts with a certain substrate or other layer may be construed to include starting with a first graded step away from such lattice constant, especially where there has not been any previous strain introduced into the structure by a lattice mismatch, even though such a first graded step may actually create enough strain to cause an array of defects to be started.

In practice, the graded layer has biaxial, tensile strain in the growth plane, which dilates its lattice constant as compared to the normal lattice constant of the same material composition in unstrained (relaxed) condition. Therefore, in order to terminate the graded layer with a particular desired lattice constant for the next subcell to be grown on the graded layer, an appropriate compositional over-shoot in the graded layer (typically determined empirically) is usually required in order to provide an actual in-plane terminal lattice constant that is equal to normal (relaxed) lattice constant of the material of the next subcell so that the material of the next subcell can be grown fully relaxed. Such over-shoot is recommended for all of the graded layers in the MMT photovoltaic converter structures, both −GL and +GL, in order to produce relaxed subcell active layers and minimize defect generation due to lattice mismatch. Because the first graded layer 22 starts with a larger lattice constant on the parent substrate 20 and terminates with a smaller lattice constant, it is designated as a −GL layer, as explained above, and its crystalline structures are in tension, which will be at least partially offset by the second +GL 32, which will be in compression, as will be explained below.

As another point of clarification and convenience to minimize cumbersome, repetitious explanations, when statements or descriptions are made herein to the effect that a certain layer is growing or has been grown on a substrate or other layer, it can mean either that such certain layer is growing or has been grown directly on the substrate or other layer or that it is growing or has been grown on or over one or more intervening layers unless otherwise stated. In other words, for example, a recitation of a layer B growing on a substrate or layer A does not necessarily mean that the layer B is growing directly on the substrate or layer A with no other intervening layers or materials between the substrate or layer A and the layer B unless it recites "directly on" or the context otherwise makes it clear that it means "directly on".

An etch-stop layer 24 comprising a semiconductor material that has a lattice constant which, in the growth plane, matches the terminal lattice constant of the first −GL 22 is grown epitaxially on the first −GL 22 in the example converter 10 in FIG. 1. Then, an electrically conductive contact layer 26 also comprised of a semiconductor material with a lattice constant that matches the terminal lattice constant in the growth plane of the first −GL 22 is deposited on the etch stop layer 24. The substrate 20, first −GL 22, and etch stop layer 24 do not have to be transparent to the incident radiation, because they will all be removed after the MMT SPC 10 is mounted on the handle 40. The contact layer 26 would have to be transparent to the incident radiation, if it was left intact. However, a non-transparent contact layer 26 can be selectively removed in a pattern coincident with a conductive metal grid to leave a grid of the contact material, as is well known in the art.

Figure 2:
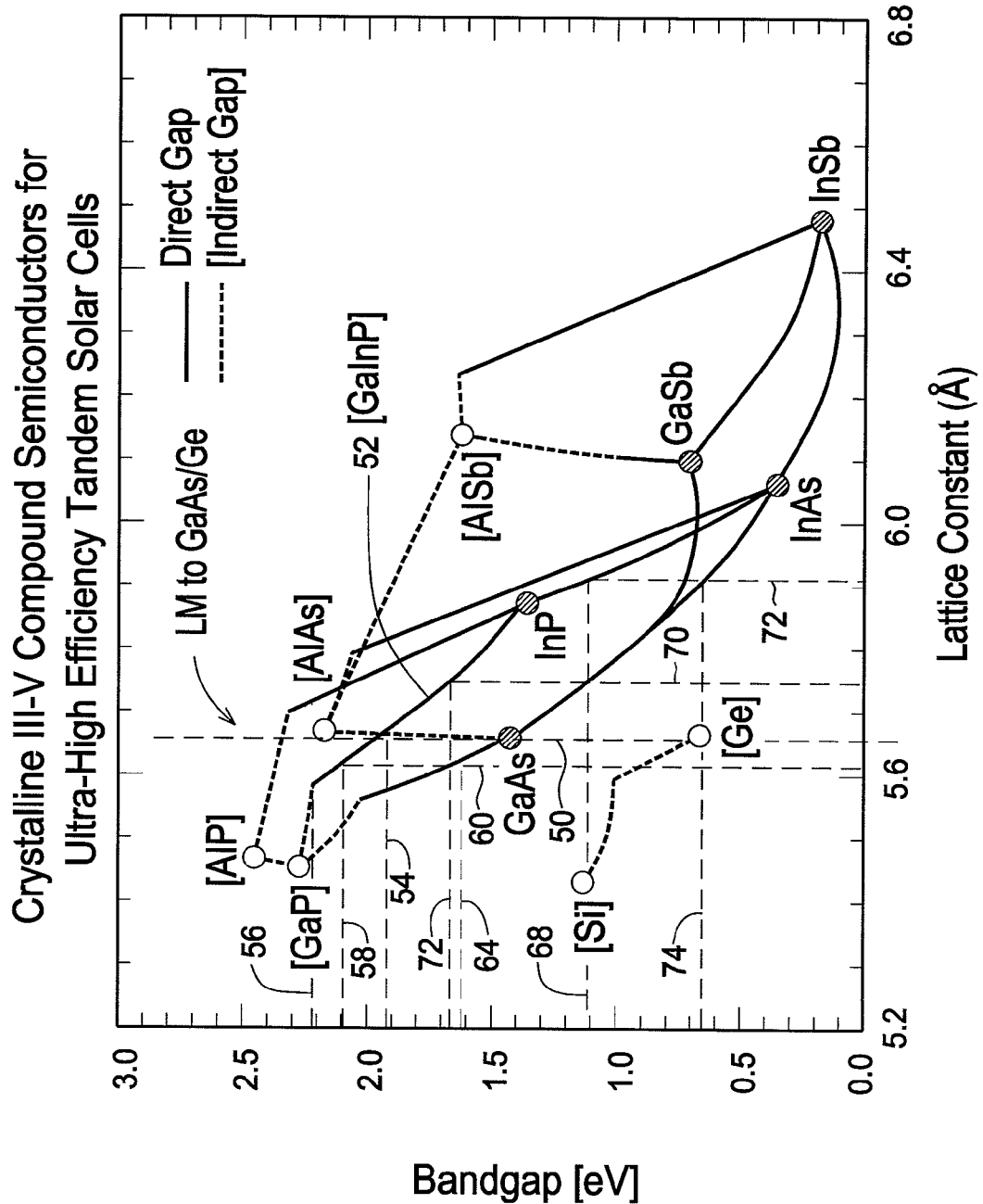
FIG. 2 is a bandgap versus lattice constant graphical representation for crystalline Group III-V compounds showing the bandgaps and lattice constants of the materials described in the example converter in FIG. 1.

The front subcell 12 comprising a high bandgap semiconductor material with a lattice constant that matches the terminal lattice constant in the growth plane of the first −GL 22 is grown epitaxially on the contact layer 26. Since the lattice constant of the front subcell 12 matches the terminal lattice constant in the growth plane of the −GL 22 in the growth plane, it is lattice-mismatched to the substrate 20. If the parent substrate 20 is GaAs, for example, it would have a lattice constant of 5.65 Å as illustrated by the vertical broken line 50 in the bandgap versus lattice constant chart in FIG. 2. A Ge substrate would have only a slightly higher lattice constant, as is also illustrated in FIG. 2. Therefore, as shown by the intersection of the vertical broken line 50 with the GaInP bandgap versus lattice constant curve 52 in FIG. 2 at about 1.9 eV (see the horizontal line 54), if the first subcell 12 was lattice-matched to the substrate 20, the highest possible direct bandgap for the first subcell 12 without resorting to the addition of Al would be about 1.9 eV GaInP. However, the −GL 22 can be fabricated with a terminal lattice constant in the growth plane low enough to match a GaInP semiconductor material with a direct bandgap as high as about 2.2 eV, as indicated by horizontal line 56 in FIG. 2. From a practical standpoint, however, it is believed that it would be better to avoid pushing the bandgap too close to the point where the bandgap transitions from direct to indirect, because there is some phonon crossover at and even near the direct to indirect crossover point. Solar energy absorption and conversion to electric energy is less efficient in materials that have indirect bandgaps. Therefore, while not essential, it is preferred to keep the highest bandgap about three to four phonon energies (i.e., about 100 mV) below the direct to indirect crossover level, for example about 2.1 eV, which can be provided by GaInP, as illustrated by broken horizontal line 58 in FIG. 2. $Ga_xIn_{1-x}P$, where x~0.7 has a bandgap of 2.1 eV. However, if it is desired to provide a top subcell with a bandgap in the 2.2+eV or even 2.3+eV ranges, as shown in several of the Tables II and IV models, a small amount Al can be added to maintain the direct bandgap character or the top subcell can be made thinner to balance photocurrents without significant performance loss.

As also illustrated by corresponding vertical broken line 60 in FIG. 2, $Ga_xIn_{1-x}P$, (x~0.7) material with a 2.1 eV bandgap has a lattice constant of 5.61 Å, whereas the GaAs substrate has a lattice constant of 5.65 Å (Ge lattice constant would be slightly higher at about 5.66 Å). Therefore, the first −GL 22 in the FIG. 1 example using a GaAs substrate 20 begins with a lattice constant of 5.65 Å to match the GaAs substrate and is compositionally graded to terminate with a 5.61 Å lattice constant in the growth plane. $Ga_xIn_{1-x}P$, (x~0.7) is used for the front subcell 12 to provide the desired 2.1 eV bandgap in the front subcell 12, as explained above.

The −GL 22 can be continuously graded from the beginning lattice constant (e.g., 5.65 Å) to the ending or terminal lattice constant in the growth plane (e.g., 5.61 Å), or it can be step graded, as illustrated by the intermediate stepped lattice constants 51, 51' in the lattice constant versus thickness diagram in FIG. 1. Step grading allows thinner graded layers and generally results in lower defect densities in upper active regions of the heterostructure. Persons skilled in the art know how to design and grow graded layers, including how to optimize a particular grading empirically for particular materials, structures, growing conditions, and other conventional considerations.

With either technique—continuous or step grading—the grading in −GL 22 from the lattice constant 50 of the parent substrate 20 to that smaller lattice constant 60 of the first subcell 12 creates a biaxial tension in the epiwafer due to residual strain (i.e., incomplete relaxation), which results in the epiwafer becoming mildly concave, especially when the substrate is relatively thin. For example, approximately 300 μm thickness for GaAs substrates and approximately 100 μm thickness for Ge substrates is common, either of which will bow mildly into a concave shape due to the tension (residual strain) caused by the grading and lattice-mismatch in the −GL 22, as described above. A feature of this invention, therefore, is the +GL 32 in the MMT photovoltaic converter 10 structure, which is graded in the opposite direction, i.e., to a larger lattice constant, to accommodate lower bandgap subcell(s), thus creating a biaxial compression that at least partially, if not entirely, counterbalances the biaxial tension from −GL 22 and flattens the epiwafer, as will be described in more detail below.

Before getting to that stage, however, the etch-stop layer 24 is grown epitaxially on the −GL 22 with a lattice constant that matches the terminal lattice constant in the growth plane 60 of the −GL 22 in the growth plane. The purpose of the etch-stop layer 24 is to protect the contact layer 26, front subcell 12, and other MMT photovoltaic converter 10 layers as the substrate 20 and −GL 22 are removed by an etching procedure after the MMT photovoltaic converter 10 is mounted on the handle 40, as will be described in more detail below. An optional, but not essential, step in the fabrication of the MMT photovoltaic converter 10 can include removal of at least some, preferably all, of the etch-stop layer 24 after the substrate 20 and −GL 22 are removed. Therefore, the etch-stop layer 24 can be any material that provides a good base for epitaxial growth of subsequent components, but which is more resistant than the −GL 22 material to whatever etchant is used to remove the substrate 20 and graded layer 22 after the MMT photovoltaic converter 10 is mounted on the handle. It is also preferable, but not essential, that the etch-stop layer 22 can be made of a material that itself can then be etched away or otherwise removed from the MMT SPC 10, especially if it is not transparent to the solar spectrum. Other techniques, such as epitaxial lift off (ELO) for removing the parent substrate 20 and −GL 22 could also be used. ELO is well-known in the art. See, for example, Eli Yablonovich, et al., Appl. Phys. Lett. 51 (26), Dec. 28, 1987, pp. 2222-2224.

The contact layer 26 is an electrically conductive material, such as heavily doped (Al)Ga(In)AsP, which also has a lattice constant that matches the terminal lattice constant in the growth plane 60 of the first graded layer 22 and provides a good base for subsequent epitaxial growth of subsequent components of the MMT photovoltaic converter 10. It is optional, but not essential, that the contact layer may be partially etched away after the MMT photovoltaic converter 10 is mounted on the handle 40, as will be described below, to form a grid contact coincident with a conductive metal grid that carries an electric current but does not block or interfere significantly with the incident solar radiation.

The front subcell 12 preferably, but not essentially, has its bandgap 58 in the high bandgap range, for example, the 2.1 eV discussed above. Again, it may be desirable to formulate the top subcell material to conform to the top subcell bandgap of a model solution for either an unconstrained or constrained optimum bandgap combination, as explained above. Since the terminal lattice constant in the growth plane of the first graded layer 22 in the growth plane was chosen to match the lattice constant 60 of the desired Group III-V semiconductor alloy for the front subcell 12, for example, the 5.61 Å lattice constant of the $Ga_xIn_{1-x}P$, (x~0.7) discussed above, the front subcell 12 is grown epitaxially on, and lattice-matched in the growth plane to, the terminal composition of the first graded layer 22, which is lattice-mismatched (LMM) to the parent substrate 20. The first subcell 12 is preferably, but not essentially, a double heterostructure (DH) subcell, as described in co-pending U.S. patent application Ser. Nos. 11/027,156 and 10/515,243, which are incorporated herein by reference, and as will be described in more detail below, and it can be doped to have an n/p or a p/n junction 13. Persons skilled in the art know how to design subcells, including appropriate semiconductor material compositions, thicknesses, and doping levels for desired bandgap and radiation absorption and conversion efficiencies. In general, optical thickness, i.e., enough thickness to absorb the incident radiation for a particular bandgap threshold, in Group III-V semiconductor materials is in a range of a few microns, for example, about 0.1 to 10 microns, as opposed to hundreds of microns.

If the MMT photovoltaic converter 10 is structured with the subcells 12, 14 to be connected together in electrical series, a tunnel junction 28 is positioned between the front subcell 12 and the next subcell 14, as shown in FIG. 1. Otherwise, the layer 28 could be formulated as an isolation layer to electrically insulate the subcells 12, 14 from each other and with additional contact layers for electrical connections as taught by the co-pending U.S. patent application Ser. No. 10/515,243, filed on Nov. 19, 2004, and Ser. No. 11/027,156, filed on Dec. 30, 2004, both of which are incorporated herein by reference. For purposes of describing this invention, the example MMT photovoltaic converter 10 is shown with the subcells connected in series with tunnel junctions between them, but this invention applies as well to, and can be implemented in, monolithic, multi-bandgap, tandem, solar photovoltaic converters with the subcells electrically isolated from each other. Since such monolithic, multi-bandgap, tandem, solar photovoltaic converters with electrically isolated subcells are described in the patent applications referenced above and are otherwise well-known to persons skilled in the art, once they understand the principles of this invention, it is sufficient to describe this invention with examples of series connected subcells. Therefore, it is not necessary to further describe optional implementations of the invention with electrically isolated subcells.

The tunnel junction 28 must be substantially transparent to any radiation that is not absorbed by the front subcell 12, thus should be comprised of a material that has a bandgap 62 at least as high as the bandgap 58 of the subcell 12, as shown in the bandgap chart in FIG. 1. Otherwise, it can be made very thin (~200 Å) to minimize optical absorption. Persons skilled in the art know how to make tunnel junctions, which are heavily (degeneratively) doped $n^{++}/p^{++}$ or $p^{++}/n^{++}$ semiconductor materials, depending on the polarity of the subcells. Therefore, the tunnel junction 28, comprising a heavily doped semiconductor material with a bandgap 62 at least as high as the bandgap 58 of the front subcell 12 or grown extremely thin, and which is lattice-matched to the front subcell 12, is grown epitaxially on the front subcell 12.

The middle subcell 14 preferably, but not essentially, comprises a Group III-V semiconductor material with a bandgap 64 in the medium bandgap range, as shown in the example MMT photovoltaic converter 10 in FIG. 1, or any bandgap, for example, as shown by As shown in FIG. 2, GaAsP with a bandgap 64 of about 1.6 eV has about the same lattice constant 60, e.g., 5.61 Å, as the 2.1 eV bandgap 58 of the GaInP in the front subcell 12. Specifically, $GaAs_yP_{1-y}$, where y~0.85 has a bandgap of 1.6 eV and a lattice constant of 5.61 Å, which can be used for the middle subcell 14. The middle subcell 14 is also preferably, but not essentially, a double heterostructure (DH), and it can be doped to have a n/p or p/n junction 15, as is well-known and within the capabilities of persons skilled in the art.

A second tunnel junction 30 is positioned between the middle subcell 14 and the back subcell 16. Again, tunnel junctions are well-known and within the capabilities of persons skilled in the art, so a detailed explanation of the tunnel junction 30 is not required for an understanding of this invention. Suffice it to say that the tunnel junction is preferably, but not essentially, lattice-matched to the subcell 14 on which it is grown epitaxially and that it should be substantially transparent to any radiation that is not absorbed by the middle subcell 14. Therefore, it should have a bandgap 66 at least as high as the bandgap 64 of the middle subcell 14, or it can be grown extremely thin to minimize optical absorption. Alternatively, the tunnel junction can be grown within, or after, the +GL 32.

The back subcell 16 in the example three-subcell, MMT SPC 10 in FIG. 1 preferably, but not essentially, has a bandgap 68 in the low bandgap range, for example, the 1.1 eV shown in FIGS. 1 and 2, to absorb and convert infrared energy in the solar spectrum to electricity. Again, the bottom bandgap may be formulated to conform to a model solution for theoretical maximum or near maximum solar conversion efficiency, perhaps, but not essentially, according to a global (unconstrained) model solution or to a constrained model solution as explained above. As shown in FIG. 2 by broken lines 68, 70, the Group III-V semiconductor material with the lowest lattice constant for a bandgap 68 of 1.1 eV is GaInAs. Specifically, $Ga_xIn_{1-x}As$, where x~0.20 has a bandgap 68 of 1.1 eV and a lattice constant 70 of about 5.74 Å, which is substantially higher than the 5.61 Å lattice constant of the middle subcell 14 and the front subcell 12. Therefore, a second graded layer 32 is positioned between the middle subcell 14 and the back or bottom subcell 16, as shown in FIG. 1, to transition from the lower lattice constant 60 of the front and middle subcells to the higher lattice constant 70 of the back subcell 16, so, for convenience, the second graded layer 32 is denoted +GL 32. Like the -GL 22, it is preferred, but not essential, that +GL 32 be compositionally step-graded 61, 61', instead of continuously graded, from the beginning lattice constant 60 of the front and middle subcells 12, 14 to the terminal lattice constant in the growth plane 70 equal to the lattice constant of the back subcell 16. Again, a lattice match is achieved by matching the lattice parameters in the growth plane as residual biaxial strain in the material at the terminal point of the grade will distort the otherwise cubic structure. Since the +GL 32 is positioned between the middle subcell 14 and the back subcell 16, it should also be transparent to whatever radiation that is not absorbed by the middle subcell 14 so that it does not block such radiation from reaching the back subcell 16. Therefore, the graded layer material should not have any bandgap less than the bandgap 64 of the middle subcell 14, which is 1.6 eV in the example MMT SPC 10 in FIG. 1. As shown by the intersection of broken vertical line 70 with the GaInP curve 52 and the broken horizontal line 72 in FIG. 2, this condition can be met by GaInP with bandgaps from 2.1 eV down to slightly over 1.6 eV as the $Ga_xIn_{1-x}P$ for the +GL 32 is compositionally graded from the 5.61 Å lattice constant 60 of the front and middle subcells 12, 14 up to the 5.74 Å lattice constant 70 of the back subcell 16. Therefore, the entire +GL 32 can be made transparent to radiation that is not absorbed by, thus passes through, the middle subcell 32. It should be noted that the data shown in FIG. 2 are for fully relaxed materials. Also, it should be noted that small amounts of Al can be added to any of the graded layers to increase the bandgap if needed.

The back subcell 16 can be grown epitaxially on, and lattice-matched to, the terminal end of the +GL 32 with a bandgap 68 in the low bandgap range. As shown by the broken lines 50 (lattice constant of the substrate 20) and 70 (lattice constant of the back subcell 16) in FIGS. 1 and 2, the back subcell 16 is also lattice-mismatched to the substrate 20. Like the front and middle subcells 12, 14, the back subcell 16 is preferably, but not essentially, a double heterostructure (DH) and can be n/p or p/n doped to have a junction 17, as is understood and well within the capabilities of persons skilled in the art.

A back contact layer 34 is then grown epitaxially on the back subcell 16, as shown in FIG. 1, to facilitate formation of the metallic back electrical contact 36. The layer 34 can be a heavily doped semiconductor material, such as 1.1 eV GaInAs for the example in FIG. 1, and the back electric contact 36 can be formed by electroplating, vacuum evaporating, or any other suitable technique.

As mentioned above, the +GL 32, which transitions from the smaller lattice constant 60 to the larger lattice constant 70 to enable epitaxial growth of the back subcell 16 in the lower bandgap range, causes inherent biaxial compressive forces in the epistructure that at least partially, if not entirely, counters the inherent tension caused by the first graded layer –GL 22. Therefore, these compressive forces in the +GL 32 tend to flatten the epistructure that was bowed by the tensile forces in the –GL 22. Consequently, a structure as described with at least two compositionally graded layers, at least one of which grades to a smaller lattice constant producing biaxial tension in the growth plane (denoted –GL) and at least another of which grades to a larger lattice constant producing biaxial compression in the growth plane (denoted +GL), mitigates bowing problems that occur in structures that have graded layers to only smaller lattice constants (–GL) or to only larger lattice constants (+GL). Because it is common for economy process and efficiency to grow and process semiconductor structures, such as solar energy converters, on large diameter substrates, and then, when finished, to process and dice them into individual cells or devices, bowing can cause problems. For example, bowing can interfere with mask aligning of photolithographic equipment and/or cause poor resolution of masking, and it can cause epiwafers to break during processing so the mitigation of bowing caused by a graded layer used to accommodate lattice mismatches that can be provided by the counterbalanced –GL and +GL described above has practical benefits. Once the MMT SPC 10 is mounted on the handle 40, as will be described below, it is fixed according to the shape of the handle 40, which forces the ultra-thin layers of the epistructure to remain flat or as otherwise shaped by the handle 40 after the parent substrate 20 and –GL 22 are removed.

Of course, as mentioned above, the three-subcell MMT photovoltaic converter 10 shown in FIG. 1 is only one example implementation of this invention. There does not have to be a subcell in the high bandgap range or in the medium bandgap range or in the low bandgap range, although the ability to provide at least one Group III-V semiconductor subcell with a bandgap of more than 1.9 eV without including Al in the semiconductor alloy is a distinct advantage provided by this invention, especially, but not only, when such a high bandgap greater than 1.9 eV and a low bandgap less than 1.2 eV can both be included in a monolithic, multi-bandgap, tandem, solar photovoltaic converter device grown epitaxially on a GaAs or Ge substrate. Of course, whenever there is a high bandgap and a low bandgap, a middle bandgap may also be desired in order to achieve higher energy conversion efficiencies. Also, the constrained modeling technique and growth or graded layers for lattice mismatched subcells on the parent substrates as described herein can be used to design and grow partial spectrum MMT photovoltaic converters, i.e., ones that are designed for converting energy from only discrete parts of the solar spectrum instead of all of it. For example, with spectral splitters, one part of the solar spectrum, for example, certain bands of shorter wavelength radiation, may be directed to one MMT photovoltaic converter while another part of the solar spectrum, for example, certain other bands of longer wavelength radiation, is directed to another MMT photovoltaic converter. In such circumstances, the constrained modeling technique can be used to determine MMT photovoltaic converter bandgaps for optimum energy conversion efficiencies in those bands, and the design and growth of appropriate graded layers and subcells on parent substrates as described herein can provide needed flexibility to provide such partial spectrum MMT photovoltaic converter structures.

In addition to three subcells in tandem, the invention can also be implemented with two subcells, four subcells, five subcells, or more subcells in tandem. Also, there can be more than one subcell with the same bandgap or with different bandgaps in any one or more of the high, medium, or low bandgap ranges. There can also be one or more subcells grown on the first graded layer (–GL) and one or more subcells grown on the second graded layer (+GL). While not shown in FIG. 1, a third step graded layer comprising, for example, $Ga_xIn_{1-x}P$ transitioning toward or even to InP and possibly even into $InAs_yP_{1-y}$ (with y increasing from y=0 toward, but not necessarily to, y=1) can be grown on the subcell 16 to increase the lattice constant even further to accommodate epitaxial growth of one or more even lower bandgap subcells. For example, as illustrated by broken lines 68, 70, 72, and 74 in FIG. 2, a graded layer comprising $Ga_xIn_{1-x}P$ starting with a lattice constant 70 of about 5.74 Å to match the lattice constant of about 5.74 Å of the previously described example GaInAs subcell 16 with a bandgap 68 of about 1.1 eV can be grown on that example GaInAs subcell 16 and graded to a lattice constant as large as about 5.90 Å by decreasing the Ga to zero (x→0), i.e., InP, and then adding and increasing As, i.e., growing $InAs_yP_{1-y}$ with increasing y, until the lattice constant of the $InAs_yP_{1-y}$ reaches as much as about 5.90 Å. As shown in FIG. 2, such InAsP with a terminal lattice constant in the growth plane 72 of about 5.90 Å would have a bandgap 68 as high as the subcell 16, i.e., 1.1 eV, thus is transparent to any radiation that is not absorbed by subcell 16, and can have a terminal lattice constant in the growth plane 72 as low as 5.90 Å. Therefore, a third graded layer (not shown) could accommodate epitaxial growth of a GaInAs subcell (not shown) with a low bandgap down to ~0.7 eV, as shown by broken line 74 in FIG. 2. Of course, such an additional graded layer could be terminated in a GaInP, InP, or InAsP with a terminal lattice constant in the growth plane anywhere between 5.74 Å and 5.90 Å, if desired.

This approach, which may include growing a first subcell that is lattice mismatched to the parent substrate can solve a number of problems and provide a number of advantages, some of which have already been mentioned above. For example, the use of all lattice-mismatched (to the parent substrate) subcells frees the Group III-V semiconductor subcell designs and possible bandgaps from the lattice constant constraints of the GaAs and Ge substrates, thereby enabling epitaxial growth of Group III-V subcells with bandgaps greater than 1.9 eV without having to include Al in the Group III-V semiconductor alloys. Al is very reactive and tends to getter oxygen and other impurities into the semiconductor alloys, which then cause dislocations and other defects that degrade electrical characteristics and performance of the subcells, so it is preferred to avoid Al in most, but not all, Group III-V solar cell designs. Therefore, the ability to grow Group III-V subcells epitaxially with bandgaps greater than 1.9 eV on parent substrates without having to include Al in the subcell semiconductor alloys to attain such higher bandgaps is a substantial improvement and provides significant advantages.

Being free of the lattice constant constraints of GaAs and Ge substrates also allows better optimization of multiple-bandgap designs for two, three, four, five, and more subcells to optimize energy conversion from solar radiation, including low bandgap ranges without including N, which also causes degradation of electrical characteristics, along with the high and middle bandgap ranges. Such optimization has the potential to push solar energy to electrical energy conversion efficiencies above forty percent (40%), possibly as high as 42% to 47% or more, as shown by the five-subcell modeling results in Tables III and IV for terrestrial solar concentrator applications.

Another feature illustrated in Tables I-IV is the ability to model optimal multi-bandgap designs and to fabricate the subcells to achieve those designs in a MMT photovoltaic converter structure, that not only includes bandgaps, but also other constraints and parameters into the optimization. For example, in both of the unconstrained bandgap ($E_g$ values) modeling for E-492 spectrum solutions at 25° C. (total irradiance of AM0=1366.1 W/m$^2$) and AOD85 spectrum solutions at 50° C. (total irradiance of AOD85=1,000 W/m$^2$), the models for five subcells include not only a high bandgap ($E_{g1}$) higher than 2.0 eV, but also a low bandgap ($E_{g5}$) at or near 0.7 eV. These five-subcell models show efficiencies of 43.0% and 47.3%, respectively. However, they do not account for the adverse effects of high temperatures and the need for thermal management, especially in solar concentrator applications, where temperatures can get very high. In such applications, keeping the bandgaps of the subcells higher reduces thermalization of photon energy and results in higher voltage, lower current electric power production. Both of these effects significantly reduce waste heat production. Less thermalization means more photon energy converted to electrical energy and less to heat. Higher voltage, lower current electric power production means lower Joule ($I^2R$) heat losses from the electric energy produced in the subcells.

Recognizing these benefits of lower heat production and weighing them against the relatively small marginal increase in electric energy obtainable from the longer wavelength, lower energy radiation in the solar spectrum, the E-492 spectrum solutions at 25° C. and the AOD85 spectrum solutions at 50° C. were performed again, but after introducing the constraint that the bottom subcell bandgap ($E_g$) had to be kept to at least 0.90 eV, as explained above. This constraint consciously gives up some of the marginal electrical power obtainable from the longer wavelength, lower energy portions of the solar spectrum, as also explained above, but, as shown in Tables I-IV, it also resulted in an overall increase in bandgaps for all the other subcells in the five-subcell and four-subcell models as well as in some of the three-subcell models. The corresponding decrease in solar to electrical energy conversion efficiencies was only about one percent (1%) or less, which is insignificant in view of the significant reductions in heat production from thermalization and Joule losses that such shifts to higher bandgap subcells engender. At the same time, such efficiencies as 42.4% and 46.3% for the five-subcell models and 40.8% and 44.6% for the constrained optimum bandgap, four-subcell models are still impressive, and the techniques described herein enable all of these unconstrained and constrained optimum bandgap models to be achievable with Group III-V semiconductor alloys on GaAs or Ge substrates, as explained above.

Of course, the example 0.90 eV constraint for the back or bottom subcell, as illustrated by Tables II and IV, is not the only constraint that can be implemented in this kind of modeling. Other bandgap constraints can also be used. For example, but not for limitation, models can be run with the bottom subcell bandgap constrained to no less than 0.8 eV or 1.0 eV to evaluate reduced conversion efficiencies in view of reduced heat production and other considerations (e.g., reduced spectral range and reduced overall lattice mismatch). Regardless of the minimum bandgap values tried or tested, this technique shows that is not always best to simply aim for the broadest solar energy spectrum response possible for a given number of subcells and opens the field to include optimum higher bandgap combinations for particular uses or applications that have not been considered or evaluated before this invention.

Use of this technique to achieve optimum thermal management and still maintain remarkably high solar to electric energy conversion efficiencies, as discussed above, is only one such application. Another example is to model for effective anti-reflective coating (ARC) considerations as mentioned above. It is standard practice to use ARCs on solar cells to reduce reflectance of the solar radiation at the incident surface so that more of the solar radiation enters the solar cell, where it can be absorbed and converted to electric energy, and such ARCs are used on MMT photovoltaic converter devices for the same purpose. Persons skilled in the art can determine and model an optimum distribution of the multiple bandgaps through the solar spectrum that, theoretically, would produce the best solar to electric energy conversion efficiency. However, it is more difficult to make broad-band ARCs that are effective for wavelengths above about 1,367 nm, i.e., for wavelengths that would be longer than wavelengths absorbed by a 0.9 eV bandgap material. Also, as was mentioned above, there is significantly more energy per photon (about four times more) in the marginal high energy photons than there is in the marginal low energy photons. Therefore, it is advantageous to use even slightly higher bandgap subcells that can absorb higher energy radiation where ARCs are more effective and easier to make, even though such a shift upward in the bandgap range forfeits the ability to absorb the marginal low energy radiation. The technique described above, i.e., constraining the bottom subcell bandgap to something higher than the theoretical unconstrained optimum bottom subcell bandgap, can be helpful in determining how much theoretical conversion efficiency is given up in exchange for a modest upward shift in subcell bandgap distributions that can provide more practical benefits, such as more effective ARC and less thermalization, thus more efficient energy conversion, in higher energy radiation ranges. Such practical benefits may at least partially, if not more than, offset the marginal low energy conversion losses resulting from such an upward shift in the multiple bandgap distribution.

This kind of modeling, as illustrated by Tables I-IV and explained above, not only raises the bandgap of the bottom subcell to avoid some practical problems, such as excess heat production and/or less effective anti-reflective coating (ARC), but also beneficially raises the top subcell bandgap into higher energy ranges. Further, this invention makes it not only possible, but also feasible, to provide subcells with such modeled bandgaps, including those above 1.9 eV in the higher ranges as well as those in the middle and low ranges, as explained above. However, if desired, low bandgap solar photovoltaic (SPV) and/or thermophotovoltaic (TPV) devices, such as, for example, those described in co-pending U.S. patent application Ser. No. 10/515,243, can be incorporated into a MMT photovoltaic converter device with higher bandgap subcells by providing at least one +GL with a terminal lattice constant in the growth plane that is large enough to match one or more GaInAs(P) subcells in the SPV or TPV portion of the device. For example, a +GL with a terminal lattice constant in the growth plane that matches the lattice constant of InP, i.e., about 5.87 Å would enable any of the GaInAs(P) subcell combinations to be added to the higher bandgap subcells in structures such as those described above. Such low bandgap GaInAs(P) subcells can be also accommodated by even higher terminal lattice constants, for example, the 5.90 Å lattice constant 72 described above.

While no specific examples are shown in FIG. 2, the principles described above can also be used to fabricate monolithic, multi-bandgap, tandem thermophotovoltaic converters (TPV) fabricated on lower bandgap, larger lattice constant, parent substrates, such as InP, InAs, or GaSb. In other words, starting with a parent substrate of InP, InAs, or GaSb, a −GL can be grown on the parent substrate to transition from the larger lattice constant of the parent substrate to a smaller lattice constant to accommodate growth of a first subcell. Then, after growing the first subcell (and optionally one or more intermediate subcells with lattice constants matched to the first subcell), a +GL can be grown to transition to a larger lattice constant than the first subcell in order to accommodate epitaxial growth of one or more intermediate or lower subcell(s) with bandgap(s) lower than the first subcell. If desired, the structure can be mounted on a handle and then the parent substrate and −GL can be removed. Such removal of the parent substrate is typically necessary if the parent substrate is not transparent to the incident spectrum. Also, there can be more than one +GL to accommodate even lower bandgap subcells.

In the example MMT photovoltaic converter 10 in FIG. 1, the elements in parentheses are optional constituents in the indicated alloys. Also, the alloys before the "/", such as in GaInP/AlGaInP in the double-heterostructure (DH) front subcell 12, is the semiconductor material that comprises the junction, whereas the alloys after the "/" are used as the passivation/carrier-confinement "PCC" layers (sometimes called cladding layers) of the DH subcells, as is well-known symbolic of any number of steps that may be used. Persons skilled in the art understand that step grading parameters and processes usually have to be optimized empirically, depending on, inter alia, the particular alloys, the grading rate, temperature of the crystalline structures, deposition processes, and ductility of the material, and, as mentioned above, some compositional over-shoot of materials to produce a desired terminal crystal lattice constant in the growth plane due to stresses and strains caused by the lattice mismatch. For just one example, in starting from a GaAs parent substrate with a lattice constant of about 5.65 Å, we found that, using a metalorganic chemical vapor deposition (MOCVD) process at 700° C., seven grading steps of about two micrometers per step with an increase of 0.06 mole fraction of P per step was satisfactory to reach a terminal lattice constant in the growth plane of about 5.59 Å to accommodate a fully relaxed GaInP top cell with a bandgap of about 2.1 eV.

As mentioned above, after the back contact metallization is applied on the back contact, the entire MMT photovoltaic converter is flipped over and mounted on a handle 40 and then the parent substrate 20, first graded layer 22, and etch-stop layer 24 are removed to leave an ultra-thin, MMT photovoltaic converter mounted on the handle 40. The MMT photovoltaic converter 10 can be mounted on or fixed to the handle 40 in any of a variety of ways, depending on the electrical properties built into the MMT photovoltaic converter 10 and into the handle 40, respectively, including whether the handle 40 is made of a conductive material or metalized in some way. If so, a conductive adhesive can be used to make a conductive attachment of the back contact 36 to the handle 40. If the handle 40 is not conductive, then a non-conductive adhesive can be used, and the back contact electrical connection to the MMT photovoltaic converter 10 can be made in any of a variety of other ways known to persons skilled in the art, for example, by connecting a wire to one or more electrical contact points on the MMT photovoltaic converter 10 that may be exposed or accessible for such connection. Some of the choices are shown in the Table V below.

TABLE V

| Handle electrical property | Bonding agent electrical property * | Method to connect to the back contact of the MMT PC |
|---|---|---|
| Insulating | Insulating | Etch completely through the ultra-thin cell structure, stop on the back contact metal, and establish a connection. |
| Insulating | Conductive | Extend the bonding agent beyond the cell perimeter and establish a connection. |
| Insulating, but coated with a conductive film | Conductive | Connect to the conductive film on the handle. |
| Conductive | Conductive | Connect directly to the handle. |

* Example suitable bonding agents may include low-viscosity insulating adhesives (e.g., epoxy), low-viscosity adhesives (e.g., epoxy), and conducting solders.

to persons skilled in the art and explained in more detail in the co-pending U.S. patent application Ser. No. 10/515,243, which is incorporated herein by reference, and in the U.S. Pat. No. 6,815,736 issued to A. Mascarenhas.

The first graded layer 22 can comprise (Al)Ga(In)AsP, where the (Al) and (In) in this example are optional. As mentioned above, it is preferred, but not required, that the graded layer 22 is compositionally step graded instead of continuous graded, to provide the intermediate lattice constants, e.g., intermediate lattice constants illustrated diagrammatically by the steps 51, 51' in FIG. 1, which are only As also mentioned above, the etch-stop layer 24 is provided to protect the rest of the epistructure of the MMT SPC 10 while the parent substrate 20 and the first graded layer 22 are removed by etching after the MMT SPC 10 is attached to the handle 40. The etch-stop layer 24 can be made, for example, of $Ga_{0.7}In_{0.3}P$, which is resistant to for example, an etchant comprising one part ammonium hydroxide to one part peroxide ($1NH_4OH:1H_2O_2$), which can be used to etch away the substrate 20 and first graded layer 22.

The contact layer 26 provides a means for conducting current into or out of the subcells, depending on their polarity.

It can be made of, for example, $GaAs_{0.85}P_{0.15}$ and grown epitaxially with a lattice constant equal to the terminal lattice constant 60 in the growth plane of the first graded layer 22. The bandgap of the contact layer 26, thus its transparency to the incident radiation, is not important, because it will be masked and etched away, for example, to a grid contact pattern that is coincident with a conductive metal grid on the front surface (not shown). After etching the contact layer into a grid, an anti-reflective coating (ARC) comprising, for example, ZnS followed by $MgF_2$, can be deposited onto the front subcell 12 over the contact grid. Such processing steps are well-known to persons skilled in the art.

As shown in FIG. 1, the front subcell 12 can be, for example a double-heterostructure (DH) subcell comprised of GaInP with, for example, AlGaInP passivation/carrier-confinement (PCC) layers. The extrinsic doping of the front subcell 12 to fabricate the n/p or p/n junction 13 can be accomplished according to conventional knowledge, which is usually by adding impurity or dopant atoms selected from higher or lower groups on the periodic table of elements. For example, but not for limitation, the GaInP front subcell 12 can be n-type doped with donor atoms from Group VI (e.g., S, Se, or Te) and p-type doped with acceptor atoms from Group II (e.g., Zn or Cd) to form n-p or p-n junction 13.

The first tunnel junction 28 has to be lattice-matched to the front subcell 12 and must have a bandgap 62 at least as high as the bandgap 58 of the front subcell 12 so that it is transparent to any radiation that is not absorbed by the front subcell 12. Otherwise, it can be grown very thin (e.g., ~200 Å total thickness) to minimize optical absorption. In the example MMT SPC 10 in FIG. 1, it can be comprised, for example, of heavily $n^{++}/p^{++}$ or $p^{++}/n^{++}$ doped $GaAs_{0.85}P_{0.15}$, depending on the polarity of the subcells. Tunnel junctions are well-known in the art, and persons skilled in the art are capable of designing and fabricating them for use in this invention. Likewise, persons skilled in the art can design and fabricate isolation layers and individual contact layers, if it is desired to electrically isolate the subcells instead of connecting them in series.

The middle subcell 14 can also be, but does not have to be, a DH subcell that is lattice-matched to the front subcell 12. It can be comprised of Ga(In)(Sb)AsP(N) with a bandgap 64 of, for example, 1.6 eV clad with (Al)GaInP PCC layers. The Ga(In)(Sb)AsP(N) is extrinsically doped, as described above, to fabricate to n/p or p/n junction 15.

The second tunnel junction 30 is lattice-matched to the middle subcell 14 and has a bandgap 66 at least as high as the bandgap 64 of the middle subcell 14 so that it is transparent to radiation that is not absorbed by the middle subcell 14. Otherwise, it can be grown very thin (e.g., ~200 Å total thickness) to minimize optical absorption. Consequently, it can be made much the same as described above for the first tunnel junction 28.

The second graded layer 32 is also preferably, but not necessarily, compositionally step graded instead of continuously graded, and it has to make the transition from the lattice constant 60 of the front and middle subcells 12, 14 (e.g., 5.61 Å) to a larger lattice constant 70 (e.g., 5.74 Å) to accommodate the back subcell 16 with its bandgap of, for example, 1.1 eV. It also has to be transparent to radiation that is not absorbed by the middle subcell 14, thus cannot have any bandgap lower than the bandgap 64 of the middle subcell 14. The example (Al)GaInP graded layer 32 shown in FIG. 1 is a +GL and suitable for this purpose, and it can be grown as discussed above.

The back subcell 16 in the example of FIG. 1 can also be, but does not have to be, a DH subcell comprised of, for example, GaInAs(Sb) epitaxially grown on the second graded layer 32 with a lattice constant 68 of 5.74 Å and a bandgap of 1.1 eV. The DH back subcell 16 in this example is clad with (Al)GaInP PCC layers. It is extrinsically doped, as explained above, to form the n/p or p/n junction 17. The back contact layer 34 can be comprised of 1.1 eV GaInAs(Sb), which is heavily doped (~$10^{19}$ cm$^{-3}$) and isotype with the base layer of the 1.1 eV subcell 16. It can be about 100 to 10,000 Å thick and is lattice-matched to the back subcell 16. Finally, the back metal contact 36 can be Gold or any of a variety of metallization schemes that will form a low-resistance, ohmic contact. Such metallization schemes are well-known to persons skilled in the art.

While much of the discussion above is directed, for example, to inverted MMT photovoltaic converter structures, the concepts, materials, and procedures described herein can also be used advantageously in non-inverted MMT photovoltaic converters, i.e., MMT photovoltaic converters in which the lower bandgap subcells are grown first on the parent or growth substrate and followed by growth of higher bandgap subcell or subcells ("lower" and "higher" here meaning merely relative to each other and not necessarily in particular low, mid-, or high bandgap ranges defined above). For example, just as the advantages of being able to grow all subcells lattice mismatched to the parent or growth substrate provides more freedom or latitude to first grow whatever higher bandgap subcell that may be desired before growing one or more lower bandgap subcell(s) in inverted structures, as described above, those advantages also provide the freedom or latitude to first grow whatever lower bandgap subcell that may be desired before growing one or more higher bandgap subcell(s) in non-inverted structures. Also, the use of one or more −GL and one or more +GL to partially or entirely offset wafer bowing caused by compressive and tensile stresses and strains in graded layers can be used in non-inverted structures as well as in inverted structures.

Figure 4:
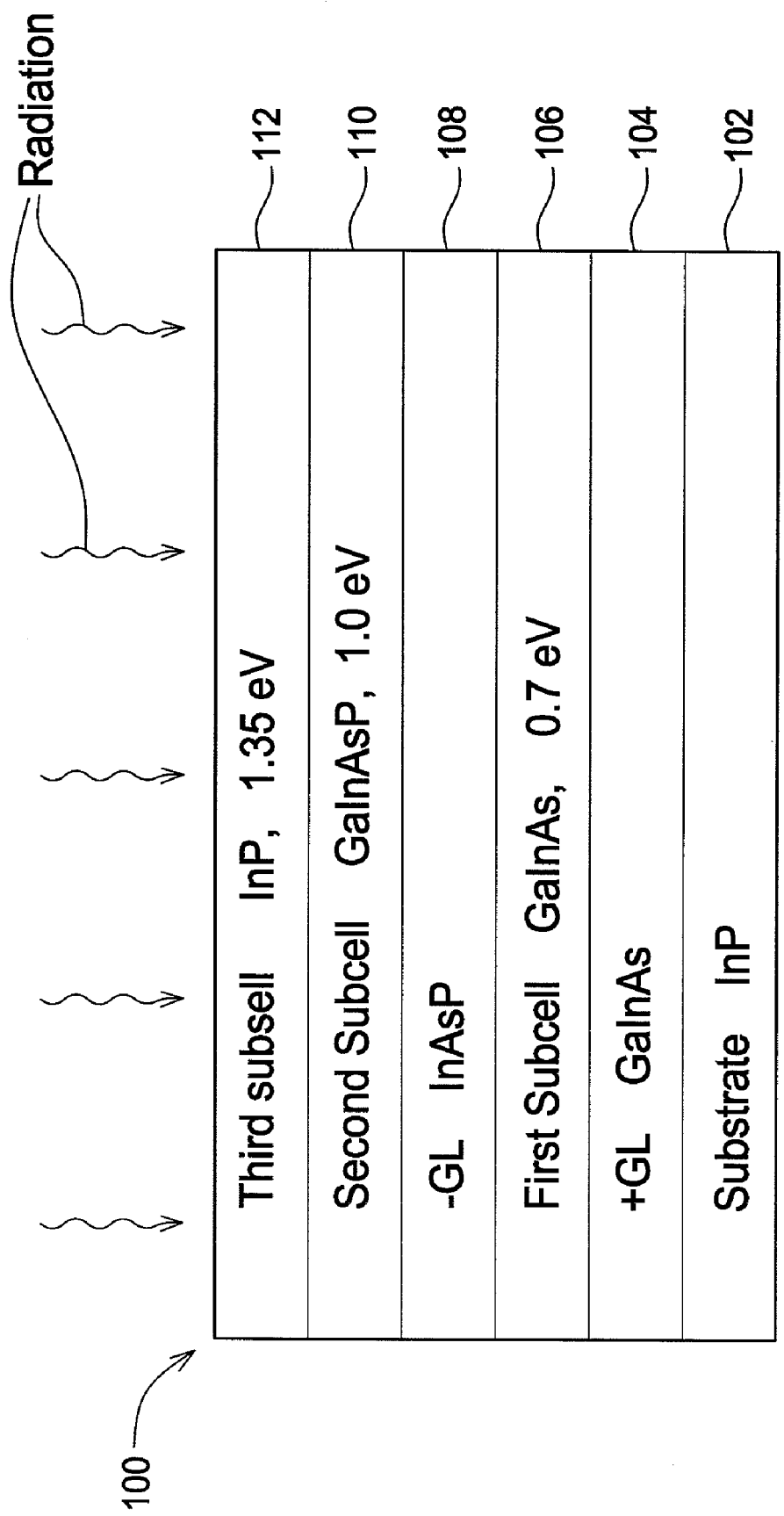
FIG. 4 is a diagrammatic view of an example of all lattice-mismatched subcells with counter-balancing graded layers in a non-inverted monolithic, multi-bandgap, strain-counterbalanced, photovoltaic energy converter.

For example, but not for limitation, one can make a non-inverted MMT photovoltaic converter comprising a cell 100 as show in FIG. 4 with a desired combination of 0.7 eV, 1.0 eV, and 1.35 eV subcells 106, 110, 112, respectively, without using a germanium (Ge) substrate and get the strain counter-balancing benefit of offsetting or partially offsetting +GL and −GL described above. In this example, starting with an InP substrate 102, which has a lattice constant of about 5.869 Å, a +GL 104 comprising GaInAs can be grown on the substrate 102, with the In increasing from a GaInAs material with a lattice constant in the growth plane that matches the 5.869 Å lattice constant of the InP substrate 102 (or at a first grading step slightly larger than 5.869 Å) to a terminal layer with a lattice constant in the growth plane of about 5.886 Å, which has a bandgap of about 0.70 eV. For example, using a +GL beginning with $Ga_{0.47}In_{0.53}As$, which has a lattice constant of about 5.869 Å, the In can be increased and the Ga decreased by steps (or by constant rate of change) to a $Ga_{0.43}In_{0.57}As$ terminal layer (or perhaps with a slight over-shoot of In) to get a GaInAs terminal layer with a lattice constant in the growth plane of about 5.886 Å. Then, a first subcell 106 of GaInAs, for example, fully relaxed $Ga_{0.43}In_{0.57}As$, with a lattice constant of about 5.886 Å and a bandgap of about 0.7 eV can be grown on the +GL 104. After growth of the first subcell 106, a −GL 108 comprising InAsP beginning with a lattice constant of about 5.886 Å, for example, $In_{0.912}As_{0.088}P$ with a bandgap of about 1.25 eV, can be graded back to InP (or perhaps also adding a small amount of Ga for over-shoot) to terminate with a lattice constant in the growth plane of about 5.869 Å and a bandgap of about 1.35 eV. A second subcell 110 comprising, for example, fully relaxed $Ga_{0.23}In_{0.77}As_{0.49}P_{0.51}$ with a lattice constant of about 5.869 Å and a bandgap of about 1.0 eV can then be grown on the −GL 108. Finally, in this example, a third subcell 112 comprising InP with a lattice constant of about 5.869 Å and a bandgap of about 1.35 eV can be grown on the second subcell 110. In this example, the −GL 108 has no bandgap less than the 1.0 eV bandgap of the second subcell 110, so it is transparent to any radiation that is transmitted through the second subcell 110 to the first subcell 106, and the −GL 108 counterbalances the strain introduced by the +GL, so the MMT photovoltaic converter 100 is strain-counterbalanced. Of course a finished MMT photovoltaic converter would also include an ARC, front and back contacts, and perhaps, subcell cladding layers, tunnel junctions, back surface reflector, buffer, and/or other layers, which are not shown in FIG. 4, but which are well known and understood by persons skilled in the art.

While a number of example aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope. The words "comprise," "comprises," "comprising," "composed," "composes," "composing," "include," "including," and "includes" when used in this specification, including the claims, are intended to specify the presence of stated features, integers, components, or steps, but they do not preclude the presence or addition of one or more other features, integers, components, steps, or groups thereof. Lattice match (ed) refers to adjacent crystalline materials that have lattice constants which are not sufficiently different to cause lattice strain that results in dislocations, fractures, wafer bowing, or other problems which degrade or destroy electrical or other characteristics or capabilities of the device. Lattice mismatch (ed) refers to adjacent crystalline materials that are sufficiently different to cause enough lattice strain to result in dislocations, fractures, wafer bowing, or other problems which degrade or destroy electrical or other characteristics or capabilities of the device.

The invention claimed is:

1. A monolithic, multi-bandgap, tandem, photovoltaic converter, comprising:
    a top subcell with a first bandgap grown epitaxially on a first graded layer that was grown epitaxially on a substrate with a starting lattice constant of the first graded layer being matched to the substrate and with a terminal lattice constant in the growth plane being smaller than the substrate lattice constant, wherein the first bandgap of the top subcell has a lattice constant that is smaller than the substrate lattice constant;
    a second graded layer grown epitaxially on the top subcell with a starting lattice constant of the second graded layer being matched to the lattice constant of the top subcell on which it is grown and a terminal lattice constant in the growth plane larger than the lattice constant of the top subcell on which it is grown, said second graded layer being transparent to radiation that can pass through the top subcell on which it is grown; and
    a bottom subcell grown epitaxially on the second graded layer with a second bandgap that is smaller than the first bandgap of the top subcell and a lattice constant that matches the terminal lattice constant in the growth plane of the second graded layer.

2. The monolithic, multi-bandgap, tandem photovoltaic converter of claim 1, wherein the substrate is the parent substrate.

3. The monolithic, multi-bandgap, tandem, photovoltaic converter of claim 1, including at least one middle subcell grown on the top subcell before the bottom subcell.

4. The monolithic, multi-bandgap, tandem, photovoltaic converter of claim 3, including at least one middle subcell grown on and lattice-matched to the top subcell before the second graded layer.

5. The monolithic, multi-bandgap, tandem, photovoltaic converter of claim 3, including at least one middle subcell grown on the second graded layer before the bottom subcell and lattice-matched to the terminal lattice constant in the growth plane of the second graded layer.

6. The monolithic, multi-bandgap, tandem, photovoltaic converter of claim 4, wherein the second graded layer is transparent to radiation transmitted by all of the subcells in front of the second graded layer.

7. The monolithic, multi-bandgap, tandem, photovoltaic converter of claim 1, wherein the top subcell, second graded layer, and bottom subcell are mounted on a handle, and wherein the substrate and the first graded layer are removed.

8. The monolithic, multi-bandgap, tandem, photovoltaic converter of claim 1, wherein the first graded layer is in tension and the second graded layer is in compression.

9. The monolithic, multi-bandgap, tandem, photovoltaic converter of claim 1, wherein the terminal lattice constant in the growth plane of the second graded layer is larger than the substrate lattice constant.

10. The monolithic, multi-bandgap, tandem, photovoltaic converter of claim 1, wherein the terminal lattice constant in the growth plane of the second graded layer is smaller than the substrate lattice constant.

11. A photovoltaic converter comprising a monolithic, multi-bandgap, tandem cell characterized by:
    high bandgap energy converter means for converting high energy radiation to electricity, wherein said high energy converter means comprises a semiconductor material with a high bandgap that was grown lattice-mismatched to a substrate by growing first graded layer means on the substrate for transitioning from a substrate lattice constant to a terminal lattice constant in the growth plane that was smaller than the substrate lattice constant and the same as the semiconductor material of the high bandgap energy converter means;
    second graded layer means grown epitaxially on the high bandgap energy converter means for transitioning from the lattice constant of the high bandgap energy converter means to a terminal lattice constant in the growth plane that is larger than the lattice constant of the high bandgap energy converter means, said second graded layer means also being transparent to radiation that can pass through the high bandgap converter means; and
    low bandgap energy converter means grown epitaxially on the second graded layer means for converting low energy radiation to electricity.

12. The photovoltaic converter of claim 11, including middle bandgap energy converter means grown epitaxially on the high bandgap energy converter means before the second graded layer means for converting middle energy radiation to electricity, wherein said middle bandgap energy converter means comprises a semiconductor material with a middle bandgap and that has a lattice constant the same as the lattice constant of the energy converter means on which it was grown.

13. The photovoltaic converter of claim 12, wherein the high bandgap, middle bandgap, and low bandgap have been determined by modeling the high bandgap, middle bandgap, and low bandgap to achieve the highest overall radiation to electrical energy conversion efficiency that is theoretically possible in a selected radiation spectrum with a constraint that limits the low bandgap to designated minimum value.

14. The photovoltaic converter of claim 11, wherein the monolithic, multi-bandgap, tandem, cell is mounted on handle means for support, and the substrate and first graded layer means are removed.

* * * * *